United States Patent
Song

(10) Patent No.: US 11,113,231 B2
(45) Date of Patent: Sep. 7, 2021

(54) METHOD OF PROCESSING IN MEMORY (PIM) USING MEMORY DEVICE AND MEMORY DEVICE PERFORMING THE SAME

(71) Applicant: SAMSUNG ELECTRONICS CO., LTD., Suwon-si (KR)

(72) Inventor: Youngsun Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 16/549,968

(22) Filed: Aug. 23, 2019

(65) Prior Publication Data

US 2020/0210369 A1    Jul. 2, 2020

(30) Foreign Application Priority Data

Dec. 31, 2018   (KR) ........................ 10-2018-0173364

(51) Int. Cl.
| | |
|---|---|
| *G06F 12/00* | (2006.01) |
| *G06F 13/00* | (2006.01) |
| *G06F 15/78* | (2006.01) |
| *G11C 11/4094* | (2006.01) |
| *G06N 3/04* | (2006.01) |
| *G06F 9/30* | (2018.01) |
| *G06F 17/16* | (2006.01) |
| *G06F 12/02* | (2006.01) |

(52) U.S. Cl.
CPC ........ *G06F 15/7821* (2013.01); *G06F 9/3001* (2013.01); *G06F 12/0246* (2013.01); *G06F 17/16* (2013.01); *G06N 3/04* (2013.01); *G11C 11/4094* (2013.01)

(58) Field of Classification Search
CPC ............... G06F 15/7821; G06F 9/3001; G06F 12/0246; G06F 17/16; G06N 3/04; G11C 11/4094
USPC ......................................................... 711/154
See application file for complete search history.

(56) References Cited

U.S. PATENT DOCUMENTS

| | | | | |
|---|---|---|---|---|
| 3,795,880 A | * | 3/1974 | Singh ..................... | G06F 7/5318 708/626 |
| 3,878,985 A | * | 4/1975 | Ghest ..................... | G06F 7/5332 708/627 |
| 5,715,187 A | * | 2/1998 | Chen ......................... | G06F 1/03 708/620 |

(Continued)

*Primary Examiner* — Sheng Jen Tsai
(74) *Attorney, Agent, or Firm* — Volentine, Whitt & Francos, PLLC

(57) ABSTRACT

In a processing in memory (PIM) method using a memory device, m*n multiplicand arrangement bits are stored in m*n memory cells by copying and arranging m multiplicand bits of a multiplicand value and m*n multiplier arrangement bits are stored in m*n read-write unit circuits corresponding to the m*n memory cells by copying and arranging n multiplier bits of a multiplier value. The m*n multiplicand arrangement bits stored in the m*n memory cells are selectively read based on the m*n multiplier arrangement bits stored in the m*n read-write unit circuits, and m*n multiplication bits are stored in the m*n read-write unit circuits based on the selectively read m*n multiplicand arrangement bits. A multiplication value of the multiplicand value and the multiplier value is determined based on the m*n multiplication bits stored in the m*n read-write unit circuits.

18 Claims, 35 Drawing Sheets

(56) References Cited

U.S. PATENT DOCUMENTS

| | | | |
|---|---|---|---|
| 6,513,054 B1 | 1/2003 | Carroll | |
| 6,571,268 B1 * | 5/2003 | Giacalone | G06F 5/01 708/524 |
| 7,167,890 B2 | 1/2007 | Lin et al. | |
| 8,238,173 B2 * | 8/2012 | Akerib | G11C 29/34 365/189.15 |
| 8,583,898 B2 | 11/2013 | Greyzck | |
| 8,725,787 B2 | 5/2014 | Peleg | |
| 9,153,230 B2 | 10/2015 | Maaninen | |
| 9,280,315 B2 | 3/2016 | Azadet et al. | |
| 9,378,184 B2 | 6/2016 | Han et al. | |
| 9,477,636 B2 | 10/2016 | Walker et al. | |
| 9,558,812 B2 * | 1/2017 | Akerib | G11C 11/418 |
| 9,760,533 B2 | 9/2017 | Fick et al. | |
| 10,528,643 B1 * | 1/2020 | Choi | G06F 17/16 |
| 10,534,840 B1 * | 1/2020 | Petti | G06N 3/04 |
| 2003/0055860 A1 | 3/2003 | Giacalone et al. | |
| 2004/0122887 A1 * | 6/2004 | Macy | G06F 17/16 708/607 |
| 2006/0008081 A1 * | 1/2006 | Higashi | G06F 7/728 380/28 |
| 2009/0207642 A1 * | 8/2009 | Shimano | G11C 11/1675 365/72 |
| 2011/0013442 A1 * | 1/2011 | Akerib | G11C 29/34 365/49.1 |
| 2011/0106872 A1 * | 5/2011 | Hasenplaugh | G06F 7/5324 708/631 |
| 2011/0264719 A1 * | 10/2011 | Mortensen | G06F 7/4824 708/204 |
| 2012/0030267 A1 | 2/2012 | Rubio et al. | |
| 2012/0169659 A1 | 7/2012 | Welland | |
| 2012/0215826 A1 * | 8/2012 | Hansen | G06F 7/57 708/607 |
| 2015/0154005 A1 * | 6/2015 | Tseng | G06F 7/5306 708/190 |
| 2016/0026912 A1 | 1/2016 | Falcon et al. | |
| 2016/0063284 A1 | 3/2016 | Tiwari | |
| 2016/0224465 A1 * | 8/2016 | Morad | G06F 15/7825 |
| 2016/0329092 A1 * | 11/2016 | Akerib | G11C 11/418 |
| 2017/0277659 A1 * | 9/2017 | Akerib | G06N 3/08 |
| 2018/0095722 A1 | 4/2018 | Buchanan et al. | |
| 2018/0246855 A1 * | 8/2018 | Redfern | G06F 3/0683 |
| 2018/0321938 A1 * | 11/2018 | Boswell | G06F 9/3851 |
| 2019/0042237 A1 * | 2/2019 | Azizi | G06F 9/3001 |
| 2019/0266218 A1 * | 8/2019 | Scott | G06F 17/16 |
| 2019/0272308 A1 * | 9/2019 | Doi | G06F 17/16 |
| 2020/0020393 A1 * | 1/2020 | Al-Shamma | G11C 16/08 |
| 2020/0211649 A1 * | 7/2020 | Park | G06N 3/0454 |

* cited by examiner

FIG. 14

| RWU0~RWU31 | 1 | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 | 1 | 0 | 1 | 1 |
|---|---|---|---|---|---|---|---|---|---|---|---|---|---|---|---|---|---|---|---|---|---|---|---|---|---|---|---|---|---|---|---|---|
| | A3 | A3 | A3 | A3 | A3 | A3 | A3 | A2 | A2 | A2 | A2 | A2 | A2 | A2 | A2 | A1 | A1 | A1 | A1 | A1 | A1 | A1 | A1 | A0 | A0 | A0 | A0 | A0 | A0 | A0 | A0 |
| | B7 | B6 | B5 | B4 | B3 | B2 | B1 | B0 | B7 | B6 | B5 | B4 | B3 | B2 | B1 | B0 | B7 | B6 | B5 | B4 | B3 | B2 | B1 | B0 | B7 | B6 | B5 | B4 | B3 | B2 | B1 | B0 |

$$MY = MW * MX = \begin{bmatrix} W11 & W12 & \cdots & W1r \\ W21 & W22 & \cdots & W2r \\ \vdots & & \ddots & \vdots \\ Wp1 & Wp2 & \cdots & Wpr \end{bmatrix} \begin{bmatrix} X11 & X12 & \cdots & X1q \\ X21 & X22 & \cdots & X2q \\ \vdots & & \ddots & \vdots \\ Xr1 & Xr2 & \cdots & Xrq \end{bmatrix} = \begin{bmatrix} Y11 & Y12 & \cdots & Y1q \\ Y21 & Y22 & \cdots & Y2q \\ \vdots & & \ddots & \vdots \\ Yr1 & Yr2 & \cdots & Yrq \end{bmatrix}$$

$$= \begin{bmatrix} W11X11+W12X21+ & \cdots & +W1rXr1 & \cdots & W11X1q+W12X2q+ & \cdots & W1rXrq \\ W21X32+W22X21+ & \cdots & +W2rXr1 & \cdots & W21X1q+W22X2q+ & \cdots & W2rXrq \\ & \vdots & & \ddots & & \vdots & \\ Wp1X11+Wp2X21+ & \cdots & +WprXr1 & \cdots & Wp1X1q+Wp2X2q+ & \cdots & WprXrq \end{bmatrix}$$

METHOD OF PROCESSING IN MEMORY (PIM) USING MEMORY DEVICE AND MEMORY DEVICE PERFORMING THE SAME

CROSS-REFERENCE TO RELATED APPLICATION

A claim of priority under 35 USC § 119 is made to Korean Patent Application No. 10-2018-0173364, filed on Dec. 31, 2018, in the Korean Intellectual Property Office (KIPO), the entire content of which is hereby incorporated by reference.

BACKGROUND

The present disclosure relates generally to semiconductor integrated circuits, and more particularly to a method of processing in memory (PIM) using a memory device, and a memory device performing the processing in memory.

Memory bandwidth and latency are performance bottlenecks in many processing systems. Memory capacity may be increased through the use of stacked memory devices in which a plurality of semiconductor devices are stacked in a package of a memory chip. The stacked semiconductor dies may be electrically connected through the use of through-silicon vias or through-substrate vias (TSVs). In addition, a vertical NAND flash memory device includes memory cells that are disposed or stacked in a vertical direction to increase the memory capacity. Such stacking technology may increase memory capacity and also suppress bandwidth and latency penalties. However, each access by an external device to the stacked memory device involves data communication between the stacked semiconductor dies. In this case, inter-device bandwidth and inter-device latency penalties may occur twice for each access. Accordingly, the inter-device bandwidth and inter-device latency may have a significant impact on processing efficiency and power consumption of the system when a task of the external device requires multiple accesses to the stacked memory device.

SUMMARY

Embodiments of the inventive concepts provide a memory device and/or a processing in memory (PIM) method using a memory device capable of efficiently performing a processing in memory or computing in memory (CIM).

Embodiments of the inventive concepts provide a processing in memory (PIM) method using a memory device. The method includes storing m*n multiplicand arrangement bits in m*n memory cells of the memory device by copying and arranging m multiplicand bits of a multiplicand value where m and n are natural numbers; storing m*n multiplier arrangement bits in m*n read-write unit circuits of the memory device corresponding to the m*n memory cells by copying and arranging n multiplier bits of a multiplier value; selectively reading the m*n multiplicand arrangement bits stored in the m*n memory cells based on the m*n multiplier arrangement bits stored in the m*n read-write unit circuits, and storing m*n multiplication bits in the m*n read-write unit circuits based on the selectively read m*n multiplicand arrangement bits, the m*n multiplication bits corresponding to bitwise multiplied values of the m*n multiplicand arrangement bits and the m*n multiplier arrangement bits; and determining a multiplication value of the multiplicand value and the multiplier value based on the m*n multiplication bits stored in the m*n read-write unit circuits.

Embodiments of the inventive concepts further provide a processing in memory (PIM) method using a memory device. The method includes determining each of p*r*q (i, k, j) multiplication values by multiplying a (i, k) multiplicand value included in a multiplicand matrix of p rows and r columns and a (k, j) multiplier value included in a multiplier matrix of r rows and q columns, with respect to all of i, k and j, where i is a natural number from 1 to p, k is a natural number from 1 to r, and j is a natural number from 1 to q; and determining each of p*q (i, j) component values included in a multiplication matrix of p rows and q columns corresponding to a multiplication of the multiplicand matrix and the multiplier matrix, by summing the r (i, k, j) multiplication values with respect to all of k. Determining a p*r*q (i, k, j) multiplication value of the p*r*q (i, k, j) multiplication values includes storing m*n multiplicand arrangement bits in m*n memory cells of the memory device by copying and arranging m multiplicand bits of the (i, k) multiplicand value where m and n are natural numbers; storing m*n multiplier arrangement bits in m*n read-write unit circuits of the memory device corresponding to the m*n memory cells by copying and arranging n multiplier bits of the (k, j) multiplier value; selectively reading the m*n multiplicand arrangement bits stored in the m*n memory cells based on the m*n multiplier arrangement bits stored in the m*n read-write unit circuits, and storing m*n multiplication bits in the m*n read-write unit circuits based on the selectively read m*n multiplicand arrangement bits, the m*n multiplication bits corresponding to bitwise multiplied values of the m*n multiplicand arrangement bits and the m*n multiplier arrangement bits; and determining the p*r*q (i, k, j) multiplication value of the (i, k) multiplicand value and the (k, j) multiplier value based on the m*n multiplication bits stored in the m*n read-write unit circuits.

Embodiments of the inventive concepts still further provide a memory device including a data copy-arrangement circuit configured to generate multiplicand arrangement bits by copying and arranging multiplicand bits of multiplicand values included in a multiplicand matrix and to generate multiplier arrangement bits by copying and arranging multiplier bits of multiplier values included in a multiplier matrix; a memory cell array including memory cells connected to bitlines and configured to store the multiplicand arrangement bits; read-write unit circuits connected to the bitlines and configured to store the multiplier arrangement bits, receive the multiplicand arrangement bits selectively read from the memory cells based on the multiplier arrangement bits stored in the read-write unit circuits, and store multiplication bits based on the multiplicand arrangement bits selectively read from the memory cells, the multiplication bits corresponding to bitwise multiplied values of the multiplicand arrangement bits and the multiplier arrangement bits; and an operation circuit configured to determine component values of a multiplication matrix corresponding to a multiplication of the multiplicand matrix and the multiplier matrix based on the multiplication bits stored in the read-write unit circuits.

Embodiments of the inventive concepts also provide a memory system including a memory controller, and a nonvolatile memory device including a memory cell array and read-write unit circuits that access memory cells of the memory cell array responsive to the memory controller. The nonvolatile memory device stores multiplicand arrangement bits in the memory cells by copying and arranging multiplicand bits of a multiplicand value, stores multiplier arrangement bits in the read-write unit circuits corresponding to the memory cells by copying and arranging multiplier bits of a multiplier value, selectively reads the multiplicand arrangement bits stored in the memory cells based on the multiplier arrangement bits stored in the read-write unit circuits, stores multiplication bits in the read-write unit circuits based on the selectively read multiplicand arrangement bits, the multiplication bits corresponding to bitwise multiplied values of the multiplicand arrangement bits and the multiplier arrangement bits, and determines a multiplication value of the multiplicand value and the multiplier value based on the multiplication bits stored in the read-write unit circuits.

The memory device and the processing in memory (PIM) method according to embodiments of the inventive concepts may reduce processing time and power consumption by performing data-intensive processing using the read-write circuit and the operation circuit included in the memory device to reduce an amount of data transferred between the memory device and external devices.

The memory device and the processing in memory (PIM) method according to embodiments of the inventive concepts may reduce processing time and power consumption by performing data-intensive processing such as MLP (multi-layer perceptron), RNN (recurrent neural network), CNN (convolutional neural network), and the like through the efficient rearrangement of data and the parallel bitwise multiplications using the read-write circuit.

BRIEF DESCRIPTION OF THE DRAWINGS

Embodiments of the inventive concepts will be more clearly understood from the following detailed description taken in conjunction with the accompanying drawings.

FIG. 14 illustrates a diagram of multiplication bits according to a selective read operation of rearranged data according to embodiments of the inventive concepts.

FIG. 24 illustrates a diagram of an example of a matrix multiplication.

DETAILED DESCRIPTION OF THE EMBODIMENTS

Figure 1:
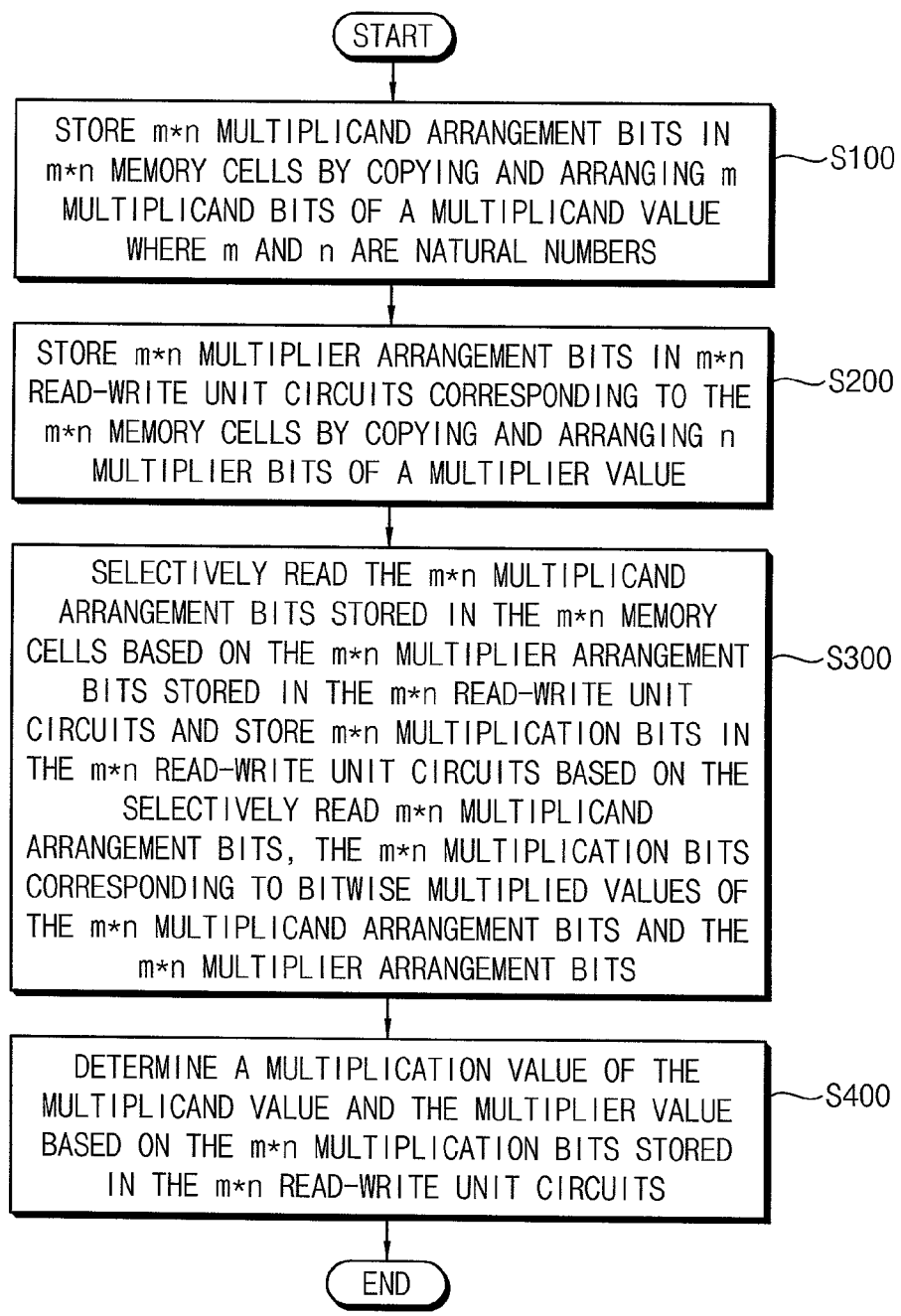
FIG. 1 illustrates a flow chart of a processing in memory (PIM) method according to embodiments of the inventive concepts.

Various example embodiments of the inventive concepts will be described more fully hereinafter with reference to the accompanying drawings. In the drawings, like numerals refer to like elements throughout, and repeated description of like elements may be omitted.

As is traditional in the field of the inventive concepts, embodiments may be described and illustrated in terms of blocks which carry out a described function or functions.

These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a flow chart of a processing in memory (PIM) method according to embodiments of the inventive concepts.

FIG. 1 illustrates a processing in memory (PIM) method using a memory device that performs a read operation and a write operation with respect to memory cells connected to bitlines using read-write unit circuits connected to the bitlines. The PIM method of FIG. 1 may include a multiplication and accumulation (MAC) operation method. The PIM method of FIG. 1 corresponds to a multiplication of two values of multiple bits, which may be referred to as a scalar multiplication. A matrix multiplication as will be described below may be performed using the scalar multiplication.

Referring to FIG. 1, m*n multiplicand arrangement bits are stored in m*n memory cells by copying and arranging m multiplicand bits of a multiplicand value where m and n are natural numbers (S100). In addition, m*n multiplier arrangement bits are stored in m*n read-write unit circuits corresponding to the m*n memory cells by copying and arranging n multiplier bits of a multiplier value (S200). The multiplicand value and the multiplier value described with respect to FIG. 1 do not indicate particular values or data or data type, but indicate two arbitrary values that are to be multiplied. In some example embodiments, the multiplicand value may correspond to a weight value of an artificial neural network (ANN) and the multiplier value may correspond to an input value or an activation value of the ANN. In some example embodiments, the multiplicand value may correspond to the input value and the multiplier value may correspond to the weight value.

The multiplicand value and the multiplier value may be copied and arranged by different schemes for bitwise multiplications. Example embodiments of the copy and arrangement scheme will be described below with reference to FIGS. 2 through 5.

The m*n multiplicand arrangement bits stored in the m*n memory cells are selectively read based on the m*n multiplier arrangement bits stored in the m*n read-write unit circuits, and m*n multiplication bits are stored in the m*n read-write unit circuits based on the selectively read m*n multiplicand arrangement bits (S300). The m*n multiplication bits correspond to bitwise multiplied values of the m*n multiplicand arrangement bits and the m*n multiplier arrangement bits. A multiplication value of the multiplicand value and the multiplier value is determined based on the m*n multiplication bits stored in the m*n read-write unit circuits (S400).

In a first example embodiment, the result of the selective read operation may be stored in latches of the read-write unit circuits in which the multiplier arrangement bits are stored. In other words, the multiplier arrangement bits stored in the read-write unit circuits may be updated or replaced with the multiplication bits.

In a second example embodiment, the read-write unit circuits may include first latches to store the multiplier arrangement bits and second latches distinct from the first latches such that the result of the selective read operation may be stored in the second latches, and the multiplier arrangement bits may be maintained without being replaced.

Even though the PIM method according to example embodiments are described based on the first example embodiment in this disclosure, it should be understood that the same PIM method may be performed by the second example embodiment.

The PIM method using the memory device according to example embodiments performs the bitwise multiplications using the read-write unit circuits that are inevitably included in the memory device for overall operations of the memory device. The bitwise multiplications may be implemented through storing of the properly rearranged data bits and the selective read operation of the stored data bits. Example embodiments of the selective read operation will be described below with reference to FIGS. 9 and 10.

As such, the memory device and the PIM method according to example embodiments may reduce processing time and power consumption by performing the bitwise multiplications in parallel using the efficient data rearrangement and the read-write unit circuits, and performing an addition operation as described below in the memory device.

FIGS. 2 through 5 illustrates diagrams of a data rearrangement and bitwise multiplications of the rearranged data according to embodiments of the inventive concepts.

In FIGS. 2 through 5, a multiplicand value VA includes m multiplicand bits $A0$~$Am-1$, and a multiplier value VB includes n multiplier bits $B0$~$Bn-1$. A multiplication value VA*VB of the multiplicand value VA and the multiplier value VB may be represented by Expression1.

$$VA*VB=(A0*2^0+A1*2^1+A2*2^2+\ldots+Am-1*2^{m-1})* (B0*2^0+B1*2^1+B2*2^2+\ldots+Bn-1*2^{n-1})=A0*B0*2^0+(A1*B0+A0*B1)*2^1+\ldots+(Am-1*Bn-1)*2^{m+n-2} \qquad \text{Expression1}$$

In Expression1, AiBj indicates an (i, j) multiplication bit where i is an integer from 0 to m−1 and j is an integer from 0 to n−1. The total number of the multiplication bits is m*n.

The multiplicand value VA stored in and selectively read from the memory cells and the multiplier value VB stored in the read-write unit circuits may be copied and arranged by different schemes.

Figure 2:
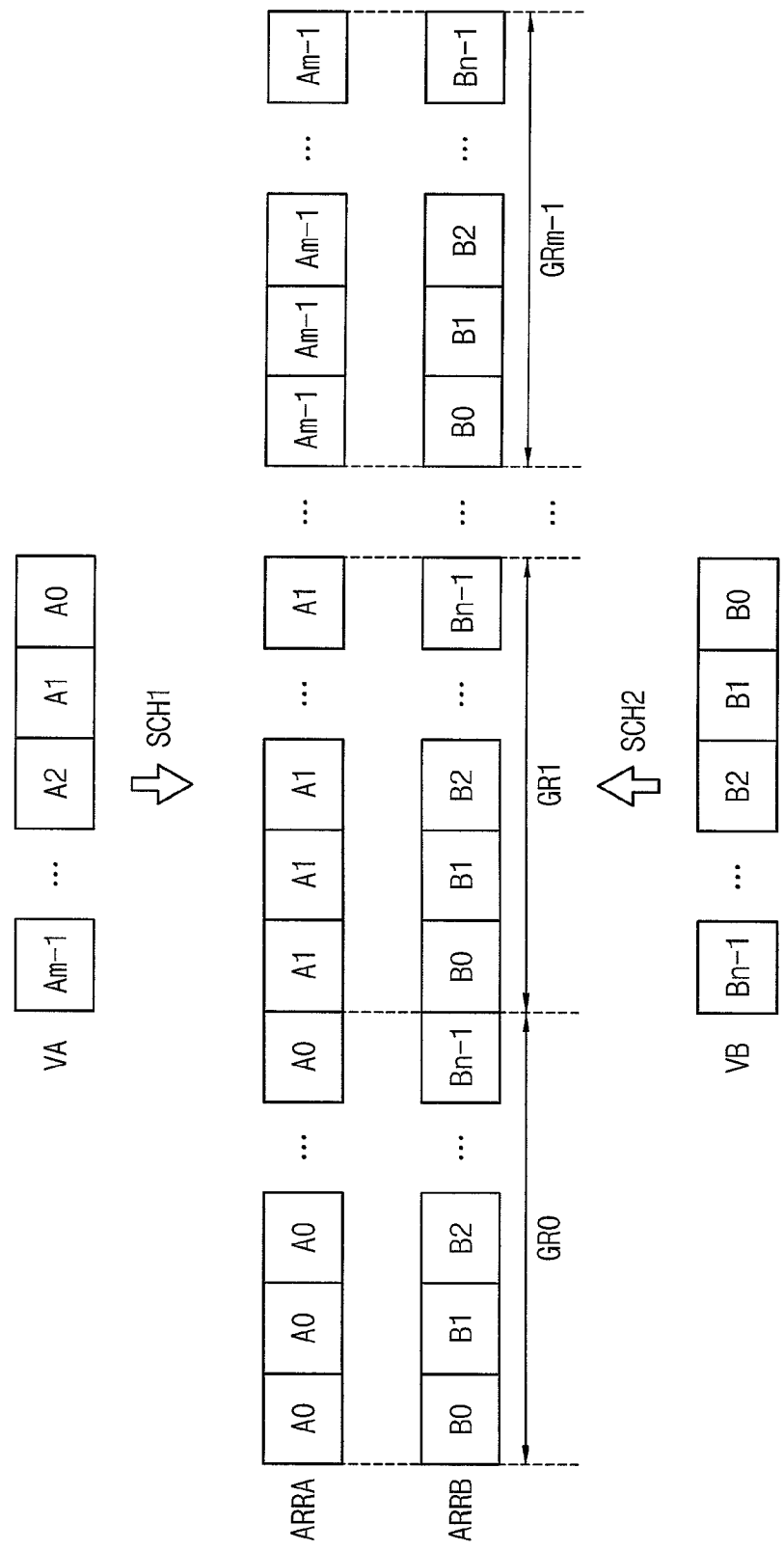
FIG. 2 illustrates a data rearrangement of multiplicand bits and multiplier bits according to embodiments of the inventive concepts.

Referring to FIG. 2, m*n multiplicand arrangement bits ARRA may be generated by a first copy and arrangement scheme SCH1 such that each bit of the m multiplicand bits $A0$~$Am-1$ is copied and arranged repeatedly n times to be adjacent to each other, and the m*n multiplier arrangement bits ARRB may be generated by a second copy and arrangement scheme SCH2 such that the n multiplier bits $B0$~$Bn-1$ are copied and arranged repeatedly m times. For example, according to arrangement scheme SCH1 multiplicand bit A0 is copied n times adjacent to each other, followed by multiplicand bit A1 copied n times adjacent to each other, and so on. Also for example, according to arrangement scheme SCH2 multiplier value VB (including bits B0~Bn−1) is repeatedly copied m times.

Figure 3:
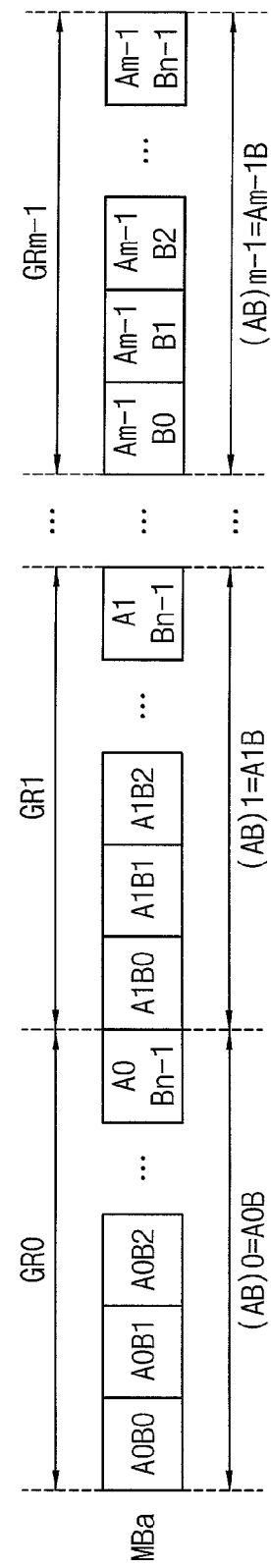
FIG. 3 illustrates bitwise multiplications of the rearranged data of FIG. 2 according to embodiments of the inventive concepts.

FIG. 3 illustrates an arrangement of multiplication bits MBa corresponding to the data rearrangement of FIG. 2. The multiplication bits MBa may be grouped into m bit groups GR0, GR1, . . . , and GRm−1 (i.e., GR0~GRm−1) corresponding to the m multiplicand bits A0~Am−1. m intermediate multiplication values (AB)0~(AB)m−1 or A0*B~Am−1*B corresponding to the m bit groups GR0~GRm−1 may be represented by Expression2.

$$(AB)i = Ai*B = Ai*(B0*2^0 + B1*2^1 + B2*2^2 + \ldots + Bn-1*2^{n-1}) \quad \text{Expression2}$$

where i is an integer from 0 to m−1.

Using the intermediate multiplication values of Expression2, the multiplication value VA*VB may be represented by Expression3.

$$VA*VB = A0*B*2^0 + A1*B*2^1 + A2*B*2^2 + \ldots + Am-1*B*2^{m-1}$$
$$= (AB)0*2^0 + (AB)1*2^1 + (AB)2*2^2 + \ldots + (AB)m-1*2^{m-1}$$
$$= SUMi\{Ai*B*2^i\} \quad \text{Expression 3}$$

As a result, the multiplication value VA*VB may be determined by summing m weighted intermediate multiplication values $A0*B*2^0$~$Am-1*B*2^{m-1}$ such that each of the m weighted intermediate multiplication values $A0*B*2^0$~$Am-1*B*2^{m-1}$ is a multiplication of each of the m intermediate multiplication values A0*B~Am−1*B and each of m bit weights $2^0$~$2^{m-1}$ corresponding to the m multiplicand bits A0~Am−1.

Figure 4:
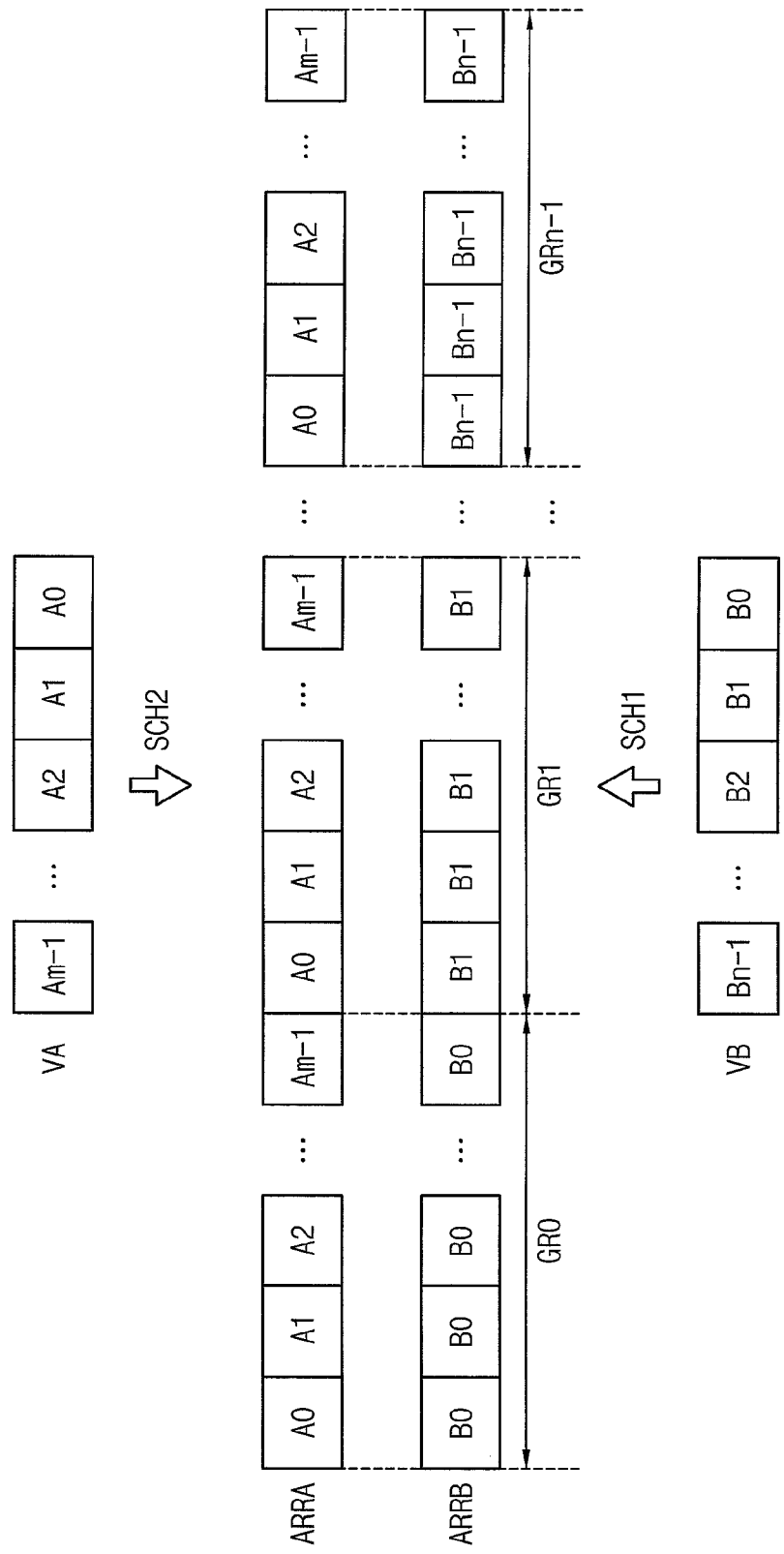
FIG. 4 illustrates a data rearrangement of multiplicand bits and multiplier bits according to other embodiments of the inventive concepts.

Referring to FIG. 4, m*n multiplier arrangement bits ARRB may be generated by the first copy and arrangement scheme SCH1 such that each bit of the n multiplier bits B0~Bn−1 is copied and arranged repeatedly m times to be adjacent to each other, and the m*n multiplicand arrangement bits ARRA may be generated by the second copy and arrangement scheme SCH2 such that the m multiplicand bits A0~Am−1 are copied and arranged repeatedly n times. For example, according to arrangement scheme SCH1 multiplier bit B0 is copied m times adjacent to each other, followed by multiplier bit B1 copied m times adjacent to each other, and so on. Also for example, according to arrangement scheme SCH2 multiplicand value VA (including bits A0~Am−1) is repeatedly copied n times.

Figure 5:
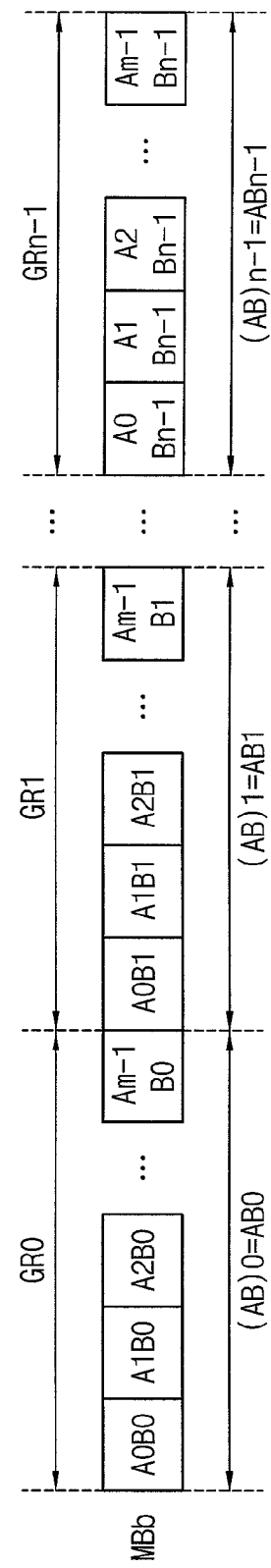
FIG. 5 illustrates bitwise multiplications of the rearranged data of FIG. 4 according to embodiments of the inventive concepts.

FIG. 5 illustrates an arrangement of multiplication bits MBb corresponding to the data rearrangement of FIG. 4. The multiplication bits MBb may be grouped into n bit groups GR0~GRn−1 corresponding to the n multiplier bits B0~Bn−1. n intermediate multiplication values (AB)0~(AB)n−1 or A*B0~A*Bn−1 corresponding to the n bit groups GR0~GRn−1 may be represented by Expression4.

$$(AB)j = A*Bj = (A0*2^0 + A1*2^1 + A2*2^2 + \ldots + Am-1*2^{m-1})*Bj \quad \text{Expression4}$$

where j is an integer from 0 to n−1.

Using the intermediate multiplication values of Expression4, the multiplication value VA*VB may be represented by Expression5.

$$VA*VB = A*B0*2^0 + A*B1*2^1 + A*B2*2^2 + \ldots + A*Bn-1*2^{n-1} \quad \text{Expression 5}$$

-continued
$$= (AB)0*2^0 + (AB)1*2^1 + (AB)2*2^2 + \ldots + (AB)n-1*2^{n-1}$$
$$= SUMj\{A*Bj*2^j\}$$

As a result, the multiplication value VA*VB may be determined by summing n weighted intermediate multiplication values $A*B0*2^0$~$A*Bn-1*2^{n-1}$ such that each of the n weighted intermediate multiplication values $A*B0*2^0$~$A*Bn-1*2^{n-1}$ is a multiplication of each of the n intermediate multiplication values A*B0~A*Bn−1 and each of n bit weights $2^0$~$2^{n-1}$ corresponding to the n multiplier bits B0~Bn−1.

Figure 6:
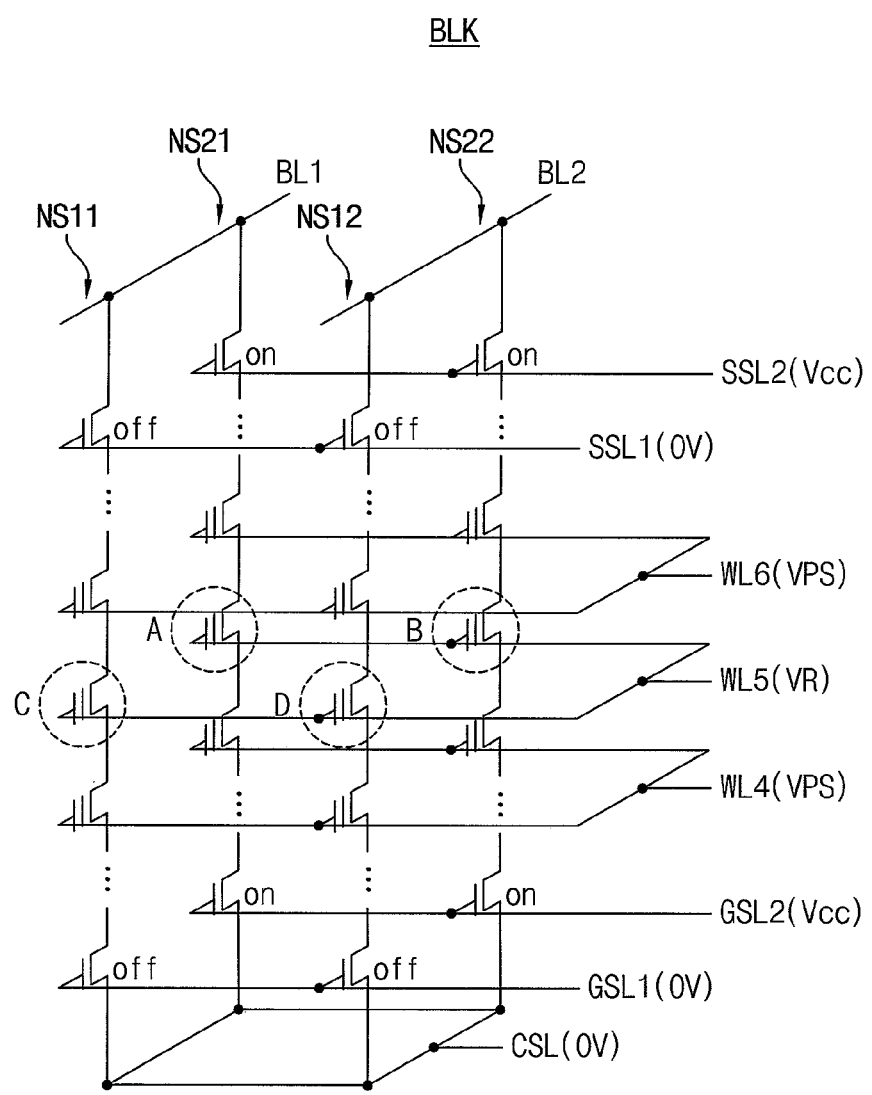
FIG. 6 illustrates a circuit diagram of a read bias condition of a three-dimensional flash memory.

FIG. 6 illustrates a circuit diagram of a read bias condition of a three-dimensional flash memory.

For convenience of illustration and description, the block BLKJ of the three-dimensional flash memory is shown in FIG. 6 as including NAND strings NS11 and NS21 connected to a first bit line BL1, and NAND strings NS12 and NS22 connected to a second bit line BL2. In other embodiments the block BLK may include different numbers of NAND strings and bit lines.

During a read operation, the first bit line BL1 and the second bit line BL2 may be pre-charged from an initialization voltage (e.g., 0V) corresponding to a value of "0" to a precharge voltage (e.g., 0.5V) corresponding to the value of "1". If NAND strings NS21 and NS22 are selected, for example, a voltage of 0 V may be applied to the first string selection line SSL1 and a power supply voltage Vcc may be applied to the second string selection line SSL2. Furthermore, the voltage of 0 V may be applied to a first ground selection line GSL1 and the power supply voltage Vcc may be applied to a second ground selection line GSL2. A selection read voltage VR may be applied to a selected word line (e.g., WL5) and the non-selection read voltage VPS may be applied to unselected word lines (e.g., WL4 and WL6).

In this example read bias condition, the drain voltage of selected memory cells A and B is 0.5 V and the source voltage of selected memory cells A and B is 0 V. In addition, the selection read voltage VR is applied to gates of the selected memory cells A and B. Furthermore, a read operation for verifying data stored at a memory cell may be performed while changing a voltage level of the selection read voltage VR. Channels of unselected NAND strings NS11 and NS12 including memory cells C and D are floated.

Figure 7:
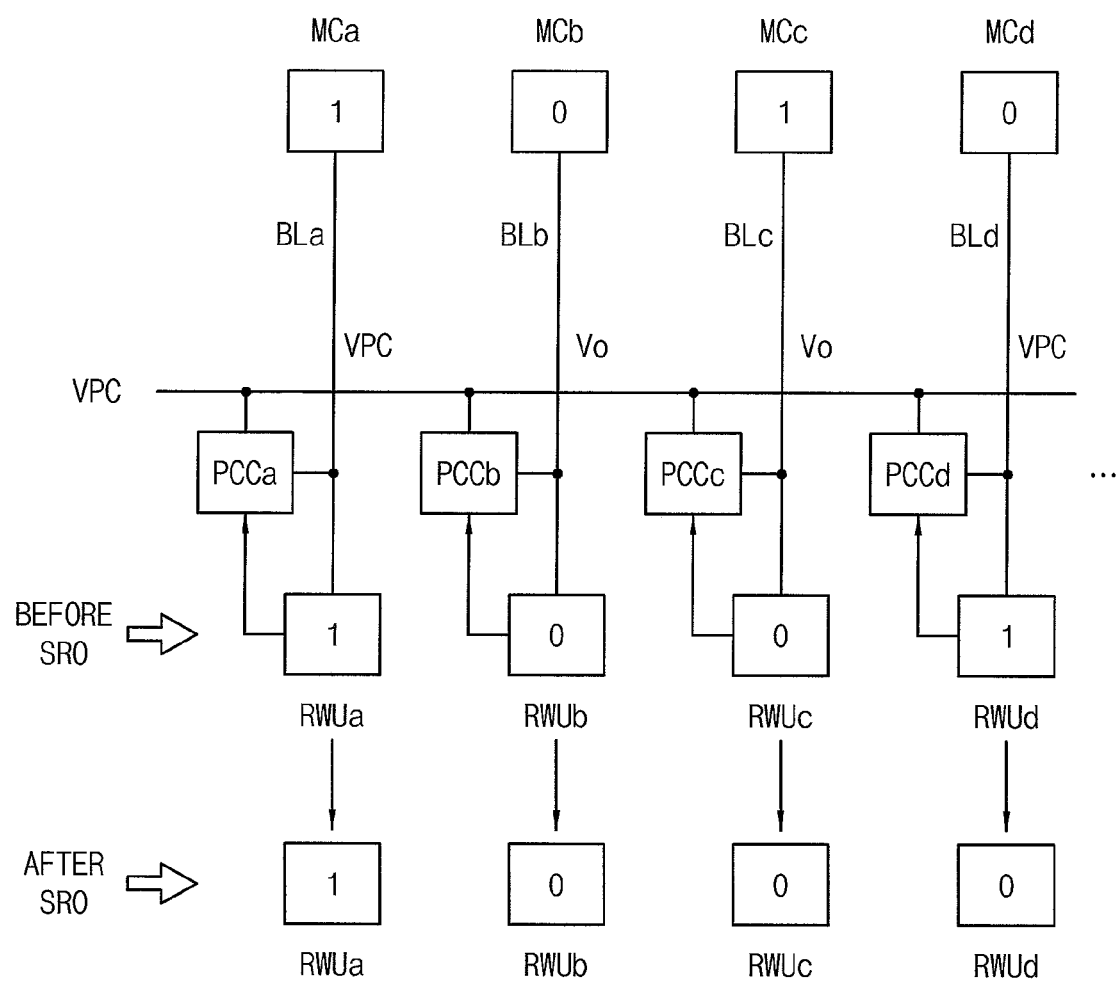
FIG. 7 illustrates a diagram of a selective read operation applicable to a processing in memory (PIM) method according to embodiments of the inventive concepts.
Figure 8:
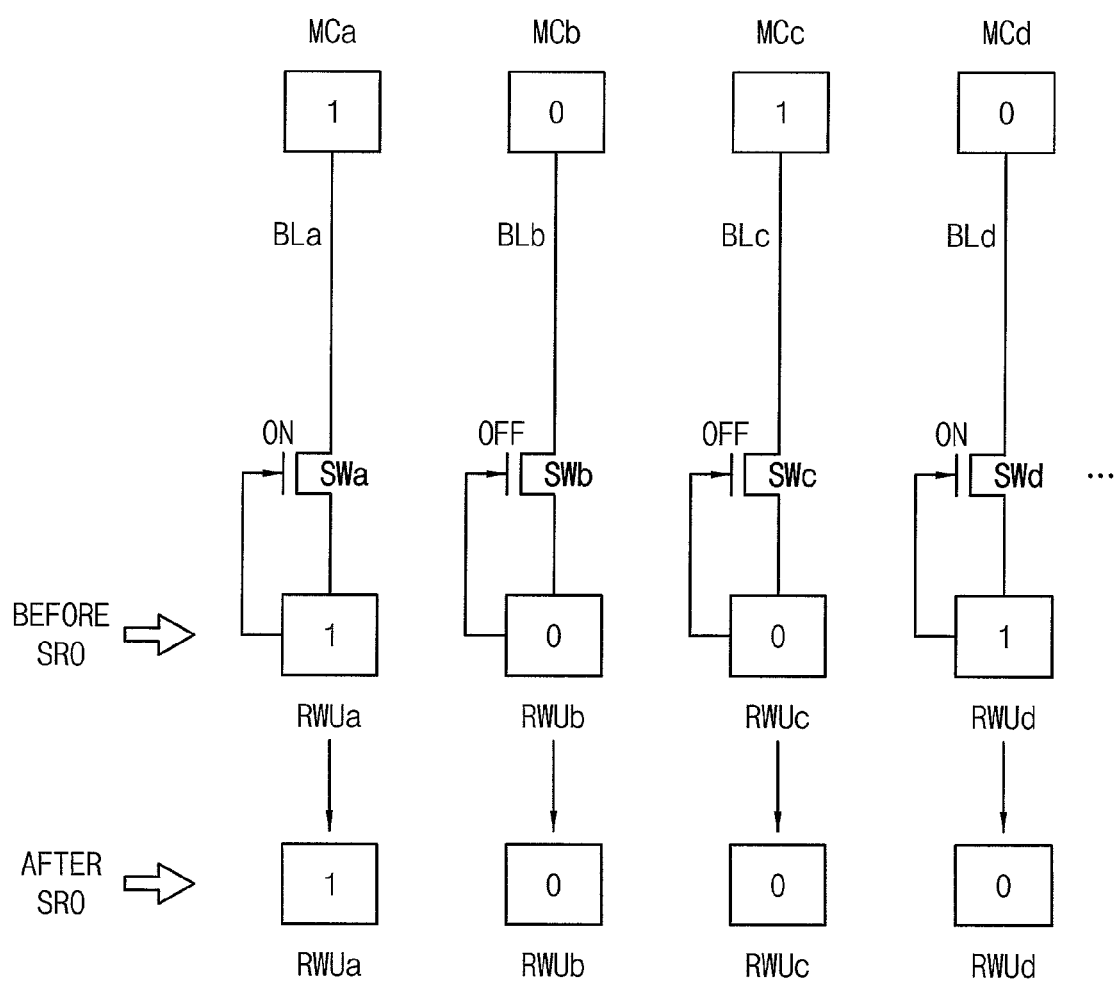
FIG. 8 illustrates a diagram of another selective read operation applicable to a processing in memory (PIM) method according to embodiments of the inventive concepts.

FIGS. 7 and 8 illustrates diagrams of respective selective read operations applicable to a PIM method according to embodiments of the inventive concepts.

FIGS. 7 and 8 illustrate configurations of four bitlines for convenience of illustration and description, but the selective read operation as described below may be implemented regardless of the number of bitlines.

Referring to FIG. 7, first through fourth precharge circuits PCCa, PCCb, PCCc and PCCd (i.e., PCCa~PCCd) included in a memory device may precharge first through fourth bitlines BLa, BLb, BLc and BLd (i.e., BLa~BLd) with a precharge voltage VPC before sensing values stored in first through fourth memory cells MCa, MCb, MCc and MCd (i.e., MCa~MCd).

In some example embodiments, as illustrated in FIG. 7, a selective read operation SRO may be performed to selectively precharge the first through fourth bitlines BLa~BLd based on multiplier arrangement bits stored in first through fourth read-write unit circuits RWUa, RWUb, RWUc and RWUd (i.e., RWUa~RWUd), respectively. In the example of FIG. 7, the first and fourth bitlines BLa and BLd corresponding to the multiplier arrangement bits having a value of "1" are precharged from an initialization voltage Vo corresponding to a value of "0" to a precharge voltage VPC corresponding to the value of "1" by the first and fourth precharge circuits PCCa and PCCd that are enabled in response to the multiplier arrangement bits having a value of "1". In contrast, the second and third bitlines BLc and BLd corresponding the multiplier arrangement bits having the value of "0" maintain the initialization voltage Vo because the second and third precharge circuits are disabled in response to the multiplier arrangement bits having the value of "0".

While (or after) the first through fourth bitlines BLa~BLd are selectively precharged as such, a sensing operation is performed with respect to the first through fourth memory cells MCa~MCd. The first memory cell MCa having the value of "1" is turned off, the first bitline BLa maintains the precharge voltage VPC and thus the first read-write unit circuit RWUa maintains the stored value of "1". The fourth memory cell MCd having the value of "0" is turned on, the fourth bitline BLd develops from the precharge voltage VPC to the initialization voltage Vo and thus the value of the fourth read-write unit circuit RWUd is updated from "1" to "0". The second and third read-write unit circuits RWUb and RWUc maintain the stored value of "0" regardless of the multiplicand arrangement bits stored in the second and third memory cells MCb and MCc.

As a result, after the selective read operation SRO is completed, the multiplier arrangement bits stored in the read-write unit circuits RWUa~RWUd are updated to the multiplication bits corresponding to the bitwise multiplication of the multiplicand arrangement bits stored in the memory cells MCa~MCd and the multiplier arrangement bits stored in the read-write unit circuits RWUa~RWUd.

Referring to FIG. 8, first through fourth switch circuits SWa, SWb, SWc and SWd (i.e., SWa~SWd) included in a memory device may control electric connections between the first through fourth bitlines BLa~BLd and first through fourth read-write unit circuits RWUa~RWUd.

In some example embodiments, as illustrated in FIG. 8, a selective read operation SRO may be performed to selectively and electrically connect the first through fourth bitlines BLa~BLd to the first through fourth read-write unit circuits RWUa~RWUd based on the multiplier arrangement bits stored in the first through fourth read-write unit circuits RWUa~RWUd, respectively. In the example of FIG. 8, the first and fourth bitlines BLa and BLd corresponding to the multiplier arrangement bits having a value of "1" are electrically connected to the first and fourth read-write unit circuits RWUa and RWUd by the first and fourth switch circuits SWa and SWd that are turned on in response to the multiplier arrangement bits having a value of "1". In contrast, the second and third bitlines BLb and BLc corresponding the multiplier arrangement bits having the value of "0" are electrically disconnected from the second and third read-write unit circuits RWUb and RWUc by the second and third switch circuits SWb and SWc that are turned off in response to the multiplier arrangement bits having a value of "0".

While the first through fourth bitlines BLa~BLd are selectively and electrically connected to the first through fourth read-write unit circuits RWUa~RWUd as such, a sensing operation is performed with respect to the first through fourth memory cells MCa~MCd.

The first read-write unit circuit RWUa electrically connected to the first memory cell MCa having the value of "1" maintains the value of "1" and the value of the fourth read-write unit circuit RWUd electrically connected to the fourth memory cell MCd having the value of "0" is updated from "1" to "0". The second and third read-write unit circuits RWUb and RWUc maintain the stored value of "0" regardless of the multiplicand arrangement bits stored in the second and third memory cells MCb and MCc.

As a result, after the selective read operation SRO is completed, the multiplier arrangement bits stored in the read-write unit circuits RWUa~RWUd are updated to the multiplication bits corresponding to the bitwise multiplication of the multiplicand arrangement bits stored in the memory cells MCa~MCd and the multiplier arrangement bits stored in the read-write unit circuits RWUa~RWUd.

Figure 9:
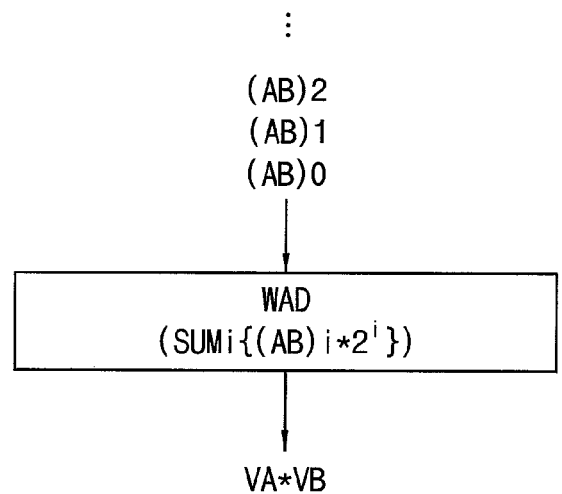
FIG. 9 illustrates a weighted adder included in a memory device according to embodiments of the inventive concepts.
Figure 10:
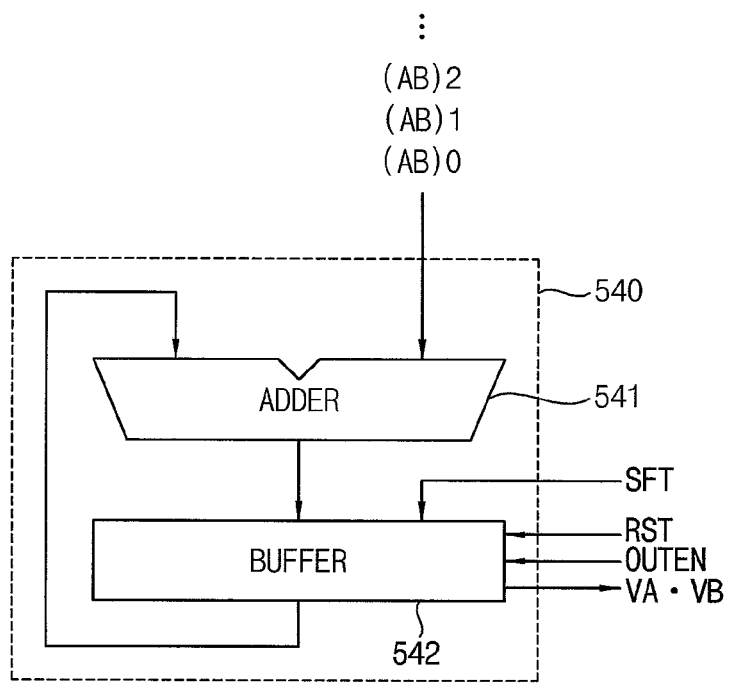
FIG. 10 illustrates another weighted adder included in a memory device according to embodiments of the inventive concepts.

FIGS. 9 and 10 illustrate diagrams of weighted adders included in a memory device according to embodiments of the inventive concepts.

Referring to FIG. 9, a weighted adder WAD may sequentially receive the above-described intermediate multiplication values (AB)i (i is an integer equal to or greater than 0) to determine the multiplication value VA*VB by summing weighted intermediate multiplication values $(AB)i*2^i$ such that each of the weighted intermediate multiplication values $(AB)i*2^i$ is a multiplication of each of the intermediate multiplication values (AB)i and each of bit weights $2^i$.

Referring to FIG. 10, a weighted adder 540 may include an adder 541 and a buffer 542. The adder 541 may perform a weighted addition operation with respect to the sequentially received intermediate multiplication values (AB)i. The multiplication of the bit weights $2^i$ may be implemented as a shift operation in response to a shift signal SFT. The weighted adder 540 may be initialized in response to a reset signal RST, and may output the multiplication value VA*VB as a result of the weighted addition operation in response to an output enable signal OUTEN. Using such weighted adder 540, determination of a multiplication value based on the multiplication bits as will be described hereinafter may be performed efficiently.

For convenience of illustration and description, example embodiments for a multiplicand value including four multiplicand bits A0~A3 and a multiplier value including eight multiplier bits B0~B7 will be described hereinafter with reference to FIGS. 11 through 18, but example embodiments are not limited to particular bit numbers. In FIGS. 11 through 18, the multiplicand value corresponds to 1001(binary)=9 (decimal) and multiplier value corresponds to 10010011 (binary)=147(decimal).

Figure 11:
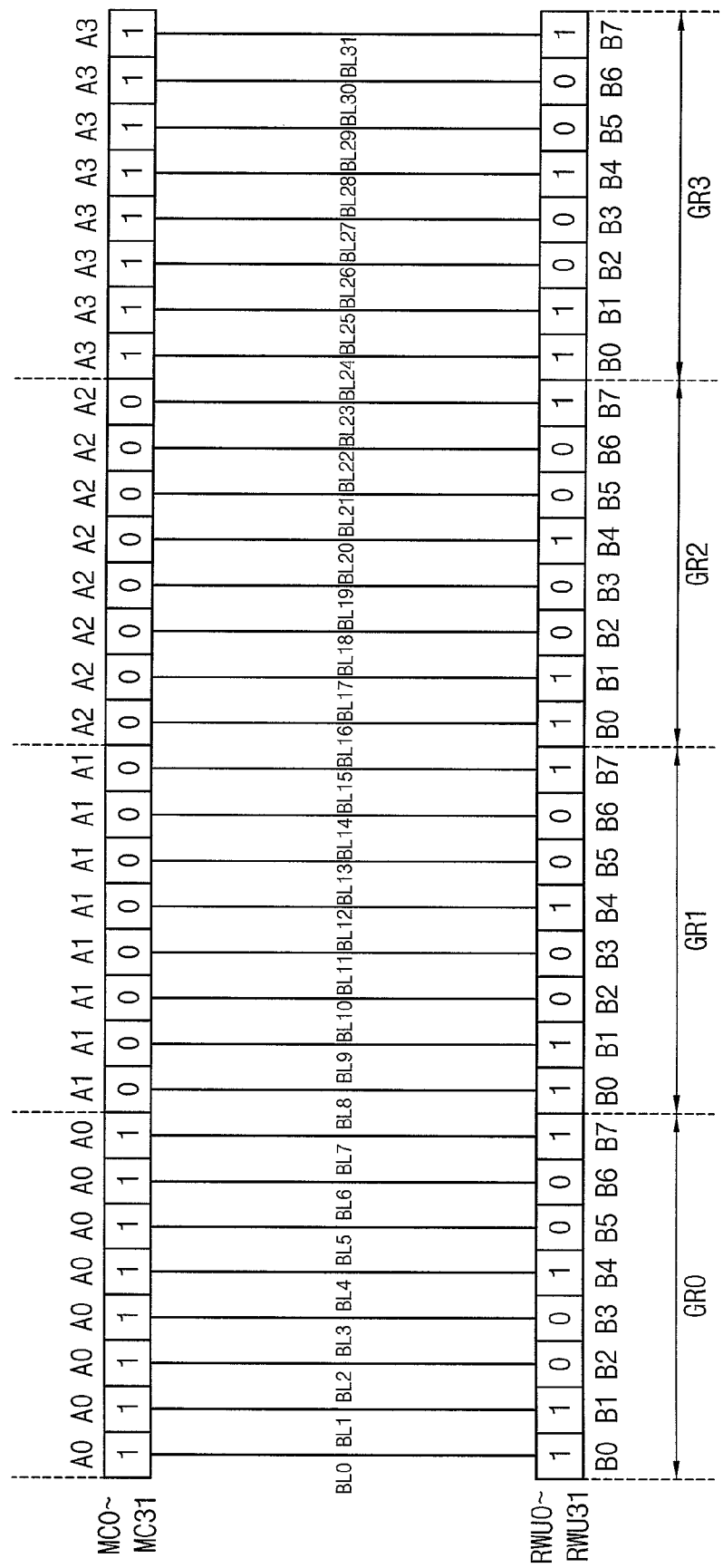
FIG. 11 illustrates a diagram of a data rearrangement according to embodiments of the inventive concepts.
Figure 12:
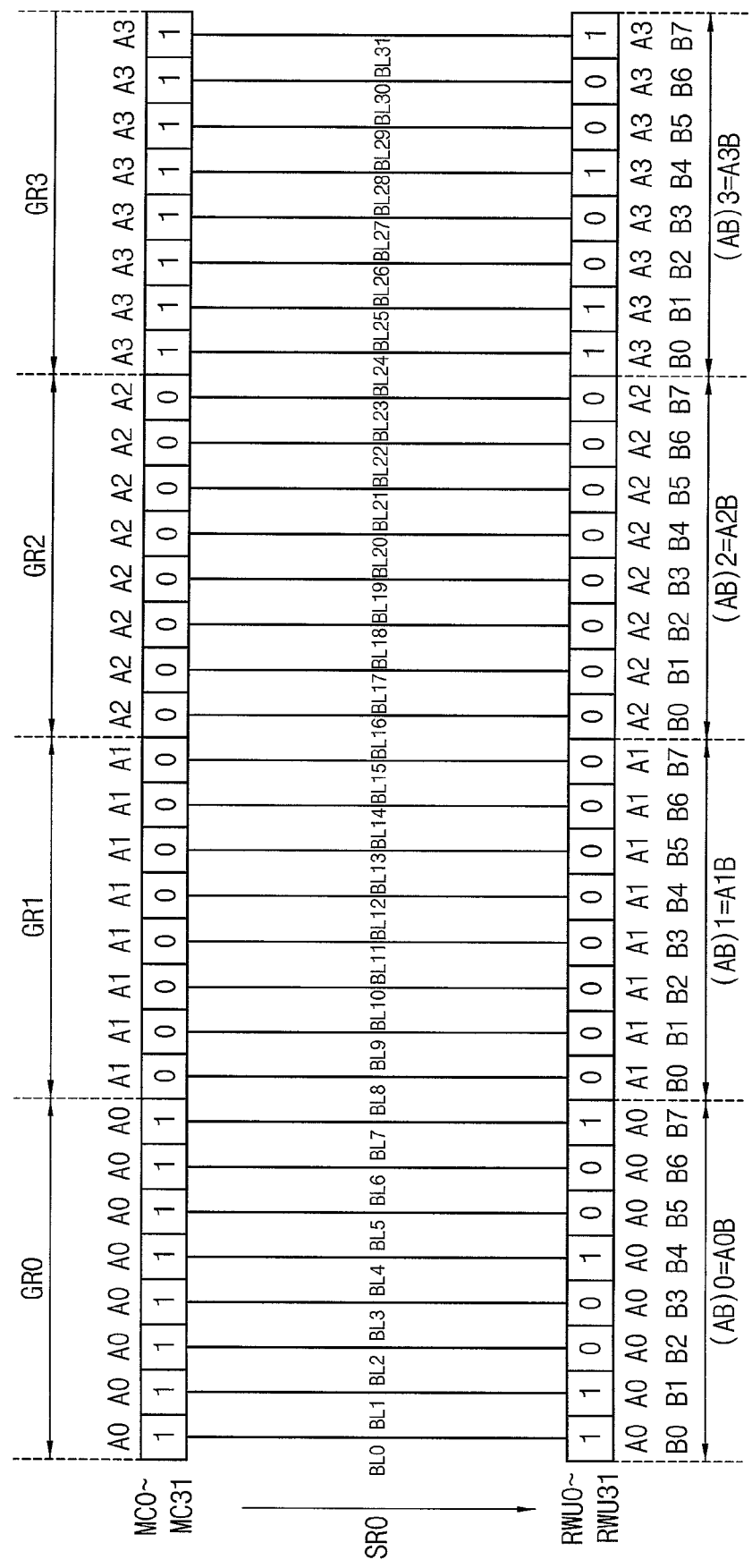
FIG. 12 illustrates a diagram of multiplication bits according to a selective read operation of the rearranged data of FIG. 11.
Figure 13:
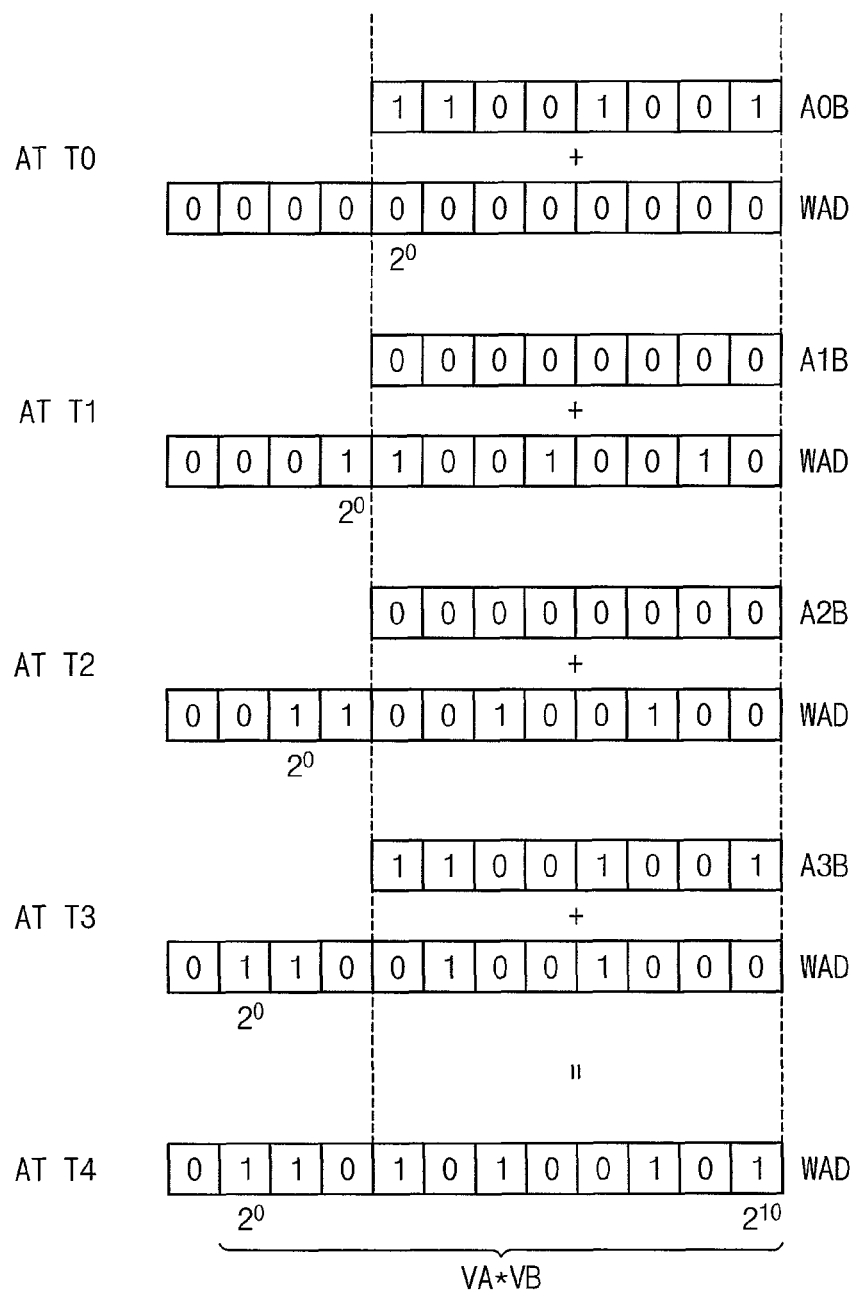
FIG. 13 illustrates a diagram of a weighted addition operation based on the multiplication bits of FIG. 12.

FIG. 11 illustrates a diagram of a data rearrangement according to embodiments of the inventive concepts. FIG. 12 illustrates a diagram of multiplication bits according to a selective read operation of the rearranged data of FIG. 11. FIG. 13 illustrates a diagram of a weighted addition operation based on the multiplication bits of FIG. 12.

FIGS. 11, 12 and 13 correspond to the data rearrangement and the bitwise multiplications of FIGS. 2 and 3. As illustrated in FIG. 11, the thirty two (4*8=32) multiplicand arrangement bits according to the first copy and arrangement scheme SCH1 are stored in the 32 memory cells MC0~MC31 corresponding the 32 bitlines BL0~BL31. After that, the 32 multiplier arrangement bits according to the second copy and arrangement scheme SCH2 are stored in the 32 read-write unit circuits RWU0~RWU31 corresponding to the 32 bitlines BL0~BL31.

Referring to FIG. 12, using the above-described selective read operation SRO, the 32 multiplier arrangement bits stored in the 32 read-write unit circuits RWU0~RWU31 are updated or replaced with the 32 multiplication bits A0*B0~A3*B7. The 32 multiplication bits A0*B0~A3*B7 are grouped into the four bit groups GR0~GR3 corresponding the four multiplicand bits A0~A3. The four intermediate multiplication values (AB)0~(AB)3 or A0*B~A3*B corresponding to the four bit groups GR0~GR3 may be represented by Expression2 as described above.

Referring to FIG. 13, the above-described weighted adder WAD sequentially receives the four intermediate multiplication values A0*B~A3*B to perform the weighted addition operation sequentially at time points T0~T3. As illustrated in FIG. 13, the multiplication of the bit weight $2^i$ is implemented by shifting the value stored in the weighted adder WAD by one digit. In other words, as illustrated in FIG. 13, the digit of $2^0$ of the stored value is shifted in the left direction by one digit before the next intermediate multiplication value is summed to the stored value.

As such, at the time point T4 when the weighted addition of the four intermediate multiplication values A0*B~A3*B is completed, the value in the weighted adder WAD is 9*147(decimal)=1323(decimal)=10100101011(binary) corresponding to the multiplication value VA*VB of the multiplicand value VA and the multiplier value VB.

Figure 15:
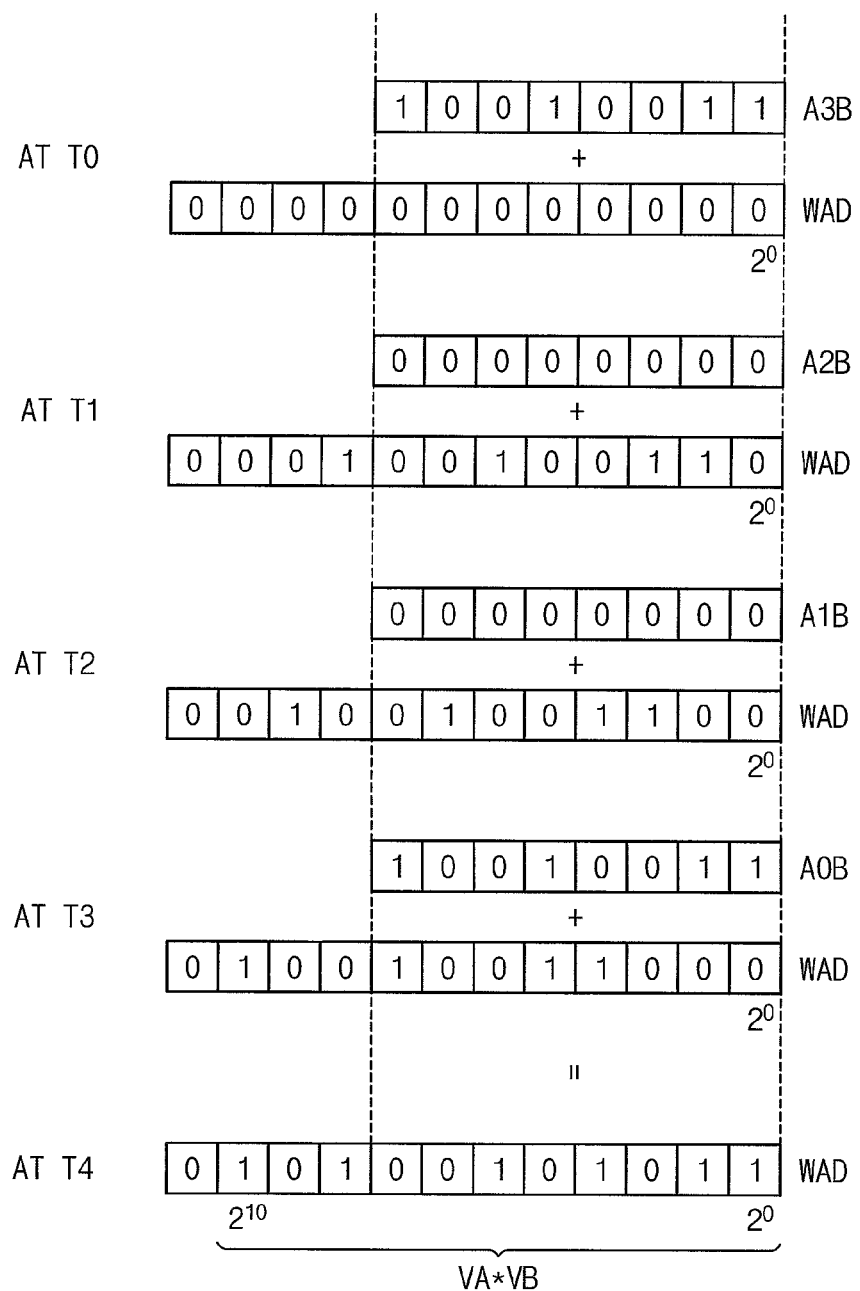
FIG. 15 illustrates a diagram of a weighted addition operation based on the multiplication bits of FIG. 14.

FIG. 14 illustrates a diagram of multiplication bits according to a selective read operation of rearranged data according an embodiment of the inventive concepts. FIG. 15 illustrates a diagram of a weighted addition operation based on the multiplication bits of FIG. 14.

FIG. 12 illustrates a case that the 32 multiplication bits A0*B0~A3*B7 are stored in the read-write unit circuits RWU0~RWU31 in ascending order, whereas FIG. 14 illustrates a case that the multiplication bits A0*B0~A3*B7 are stored in the read-write unit circuits RWU0~RWU31 in descending order. The arrangement of the multiplication bits A0*B0~A3*B7 corresponds to the data rearrangement that each of the multiplicand arrangement bits and the multiplier arrangement bits is arranged in descending order.

Referring to FIG. 15, the above-described weighted adder WAD sequentially receives the four intermediate multiplication values A0*B~A3*B to perform the weighted addition operation sequentially at time points T0~T3. The four intermediate multiplication values A0*B~A3*B are sequentially received by ascending order starting from A0*B in the example embodiment of FIG. 13, whereas the four intermediate multiplication values A0*B~A3*B are sequentially received by descending order starting from A3*B in the example embodiment of FIG. 15. As illustrated in FIG. 15, the multiplication of the bit weight $2^i$ is implemented by shifting the value stored in the weighted adder WAD by one digit. In other words, as illustrated in FIG. 15, the stored value itself is shifted in the left direction by one digit before the next intermediate multiplication value is summed to the stored value. In the example of FIG. 14, the digit of $2^0$ is not shifted and is fixed.

As such, at the time point T4 when the weighted addition of the four intermediate multiplication values A0*B~A3*B is completed, the value in the weighted adder WAD is 9*147(decimal)=1323(decimal)=10100101011(binary) corresponding to the multiplication value VA*VB of the multiplicand value VA and the multiplier value VB.

Figure 16:
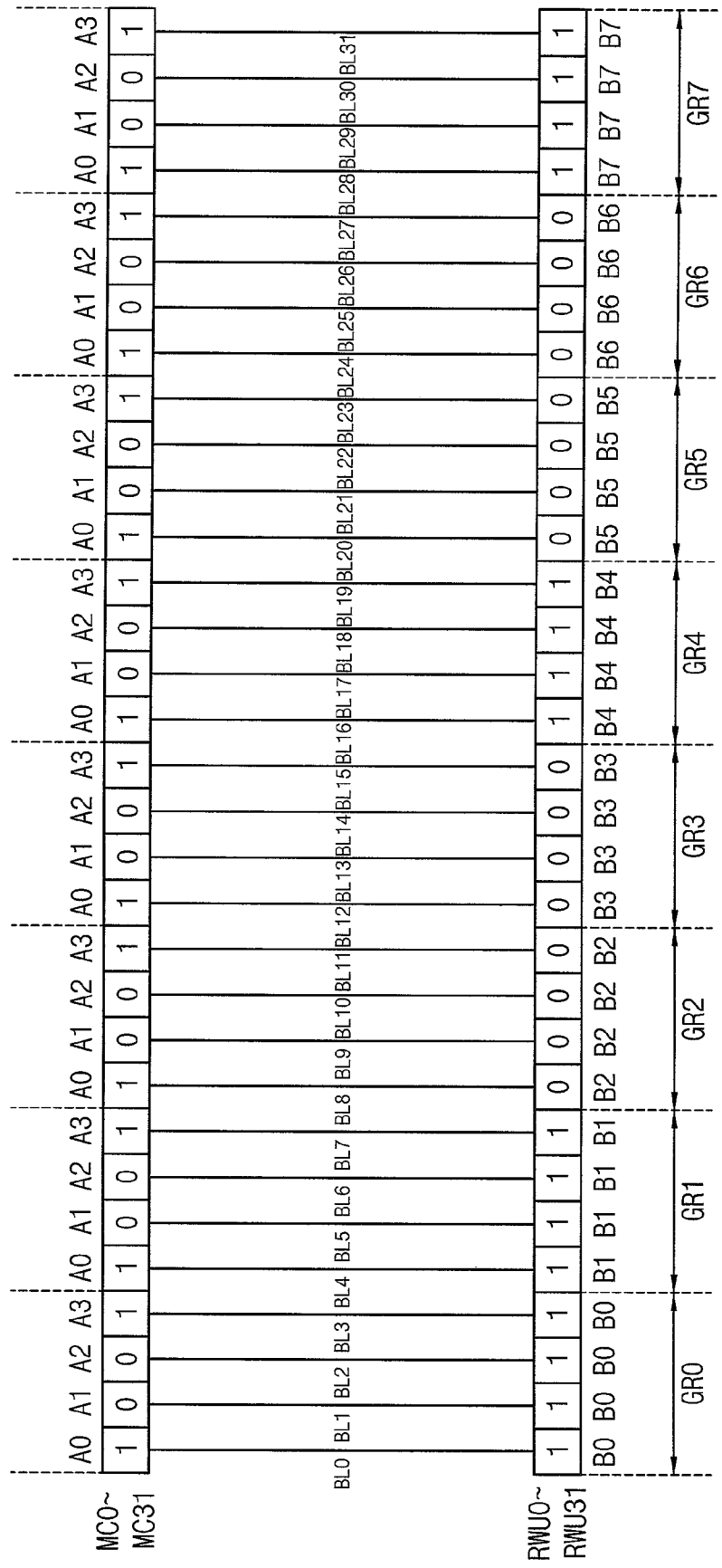
FIG. 16 illustrates a diagram of a data rearrangement according to embodiments of the inventive concepts.
Figure 17:
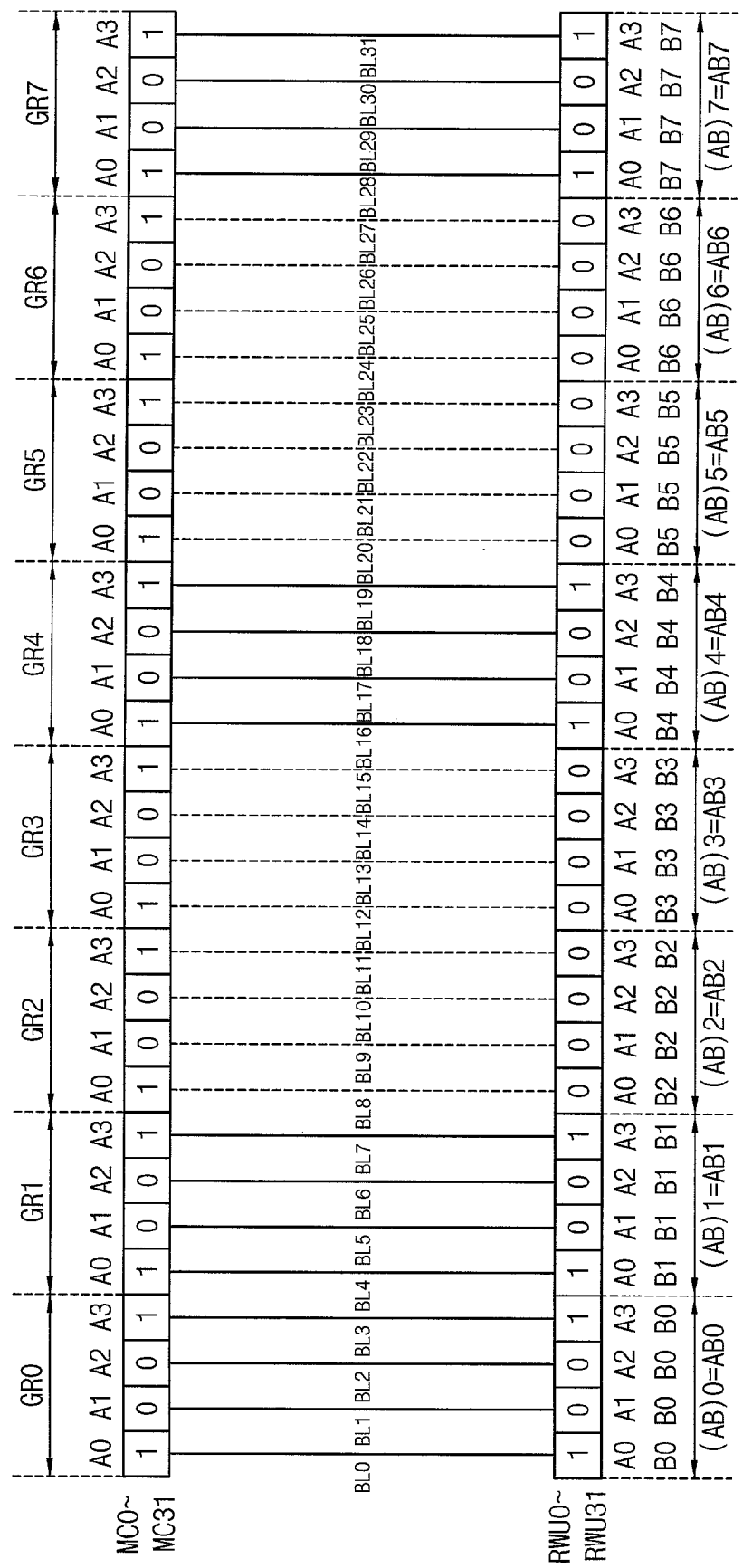
FIG. 17 illustrates a diagram of multiplication bits according to a selective read operation of the rearranged data of FIG. 16.
Figure 18:
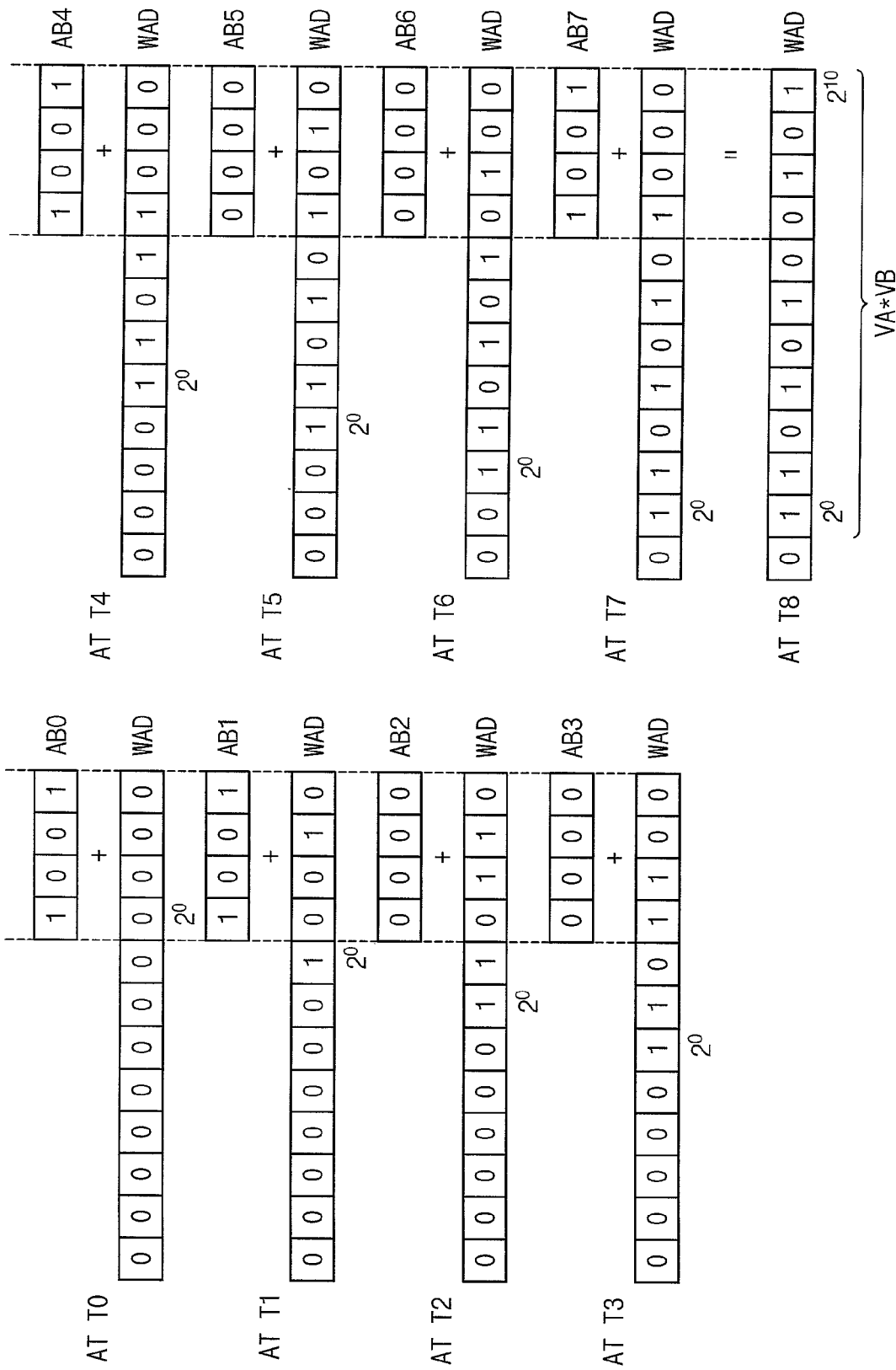
FIG. 18 illustrates a diagram of a weighted addition operation based on the multiplication bits of FIG. 17.

FIG. 16 illustrates a diagram of a data rearrangement according to embodiments of the inventive concepts. FIG. 17 illustrates a diagram of multiplication bits according to a selective read operation of the rearranged data of FIG. 16. FIG. 18 illustrates a diagram of an embodiment of a weighted addition operation based on the multiplication bits of FIG. 17.

FIGS. 16, 17 and 18 correspond to the data rearrangement and the bitwise multiplications of FIGS. 4 and 5. As illustrated in FIG. 16, the thirty two (4*8=32) multiplicand arrangement bits according to the second copy and arrangement scheme SCH2 are stored in the 32 memory cells MC0~MC31 corresponding the 32 bitlines BL0~BL31. After that, the 32 multiplier arrangement bits according to the first copy and arrangement scheme SCH1 are stored in the 32 read-write unit circuits RWU0~RWU31 corresponding to the 32 bitlines BL0~BL31.

Referring to FIG. 17, using the above-described selective read operation SRO, the 32 multiplier arrangement bits stored in the 32 read-write unit circuits RWU0~RWU31 are updated or replaced with the 32 multiplication bits A0*B0~A3*B7. The 32 multiplication bits A0*B0~A3*B7 may be grouped into the eight bit groups GR0~GR7 corresponding the eight multiplier bits B0~B7. The eight intermediate multiplication values (AB)0~(AB)7 or A*B0~A*B7 corresponding to the eight bit groups GR0-GR7 may be represented by Expression4 as described above.

Referring to FIG. 18, the above-described weighted adder WAD sequentially receives the eight intermediate multiplication values A0*B~A7*B to perform the weighted addition operation sequentially at time points T0~T7. As illustrated in FIG. 18, the multiplication of the bit weight $2^i$ is implemented by shifting the value stored in the weighted adder WAD by one digit. In other words, as illustrated in FIG. 18, the digit of $2^0$ of the stored value is shifted in the left direction by one digit before the next intermediate multiplication value is summed to the stored value.

As such, at the time point T7 when the weighted addition of the eight intermediate multiplication values A*B0~A*B7 is completed, the value in the weighted adder WAD is 9*147(decimal)=1323(decimal)=10100101011(binary) corresponding to the multiplication value VA*VB of the multiplicand value VA and the multiplier value VB.

FIGS. 19A through 19E illustrate diagrams of data rearrangement methods according to embodiments of the inventive concepts.

Although the PIM method according to embodiments of the inventive concepts have been described with reference to the data rearrangement methods of FIGS. 11, 12, 14 and 16, the inventive concepts are not limited to the above described embodiments. For example, the PIM method may be performed based on the data rearrangement methods shown in FIGS. 19A through 19E as hereinafter described.

Figure 19A:
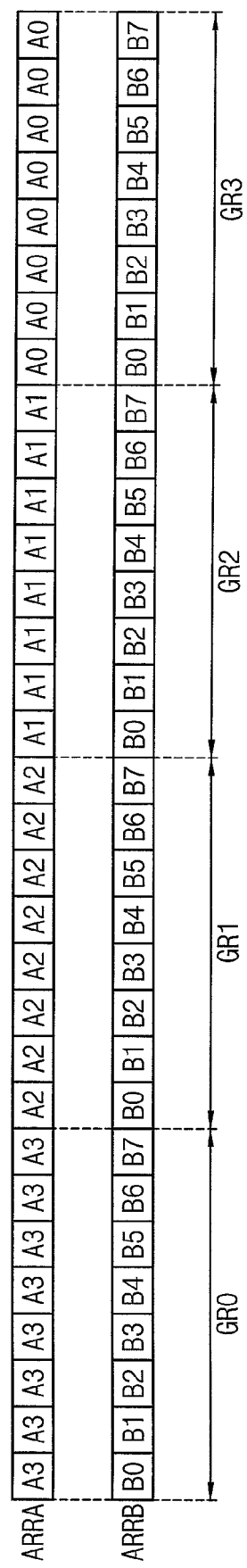
FIGS. 19A, 19B, 19C, 19D and 19E illustrate diagrams of data rearrangement methods according to embodiments of the inventive concepts.

FIG. 19A illustrates an embodiment whereby the multiplicand arrangement bits ARRA are generated by the first copy and arrangement scheme SCH1 in descending order, and the multiplier arrangement bits ARRB are generated by the second copy and arrangement scheme SCH2 in ascending order.

Figure 19B:
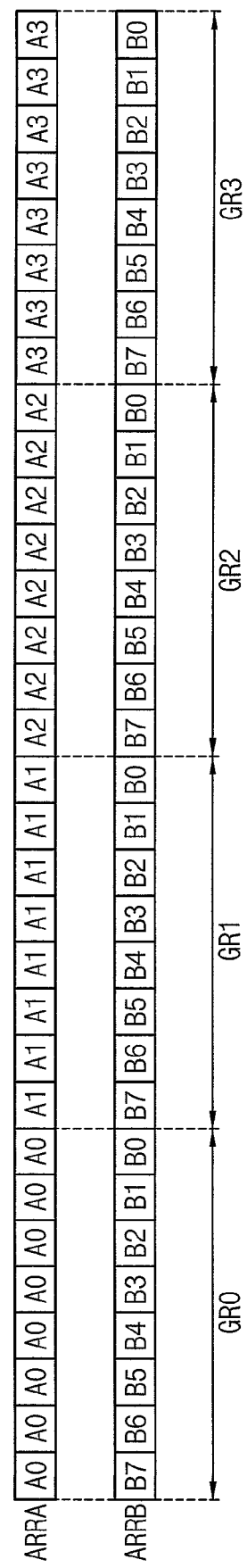

FIG. 19B illustrates an embodiment whereby the multiplicand arrangement bits ARRA are generated by the first copy and arrangement scheme SCH1 in ascending order, and the multiplier arrangement bits ARRB are generated by the second copy and arrangement scheme SCH2 in descending order.

Figure 19C:
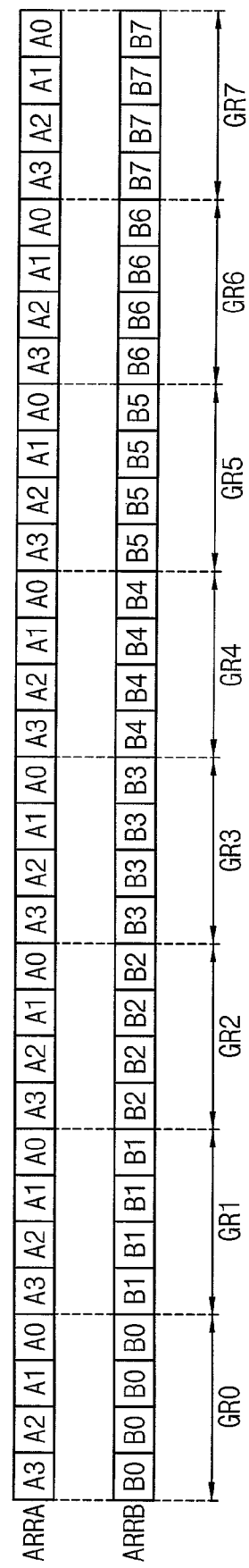

FIG. 19C illustrates an embodiment whereby the multiplicand arrangement bits ARRA are generated by the second copy and arrangement scheme SCH2 in descending order, and the multiplier arrangement bits ARRB are generated by the first copy and arrangement scheme SCH1 in ascending order.

Figure 19D:
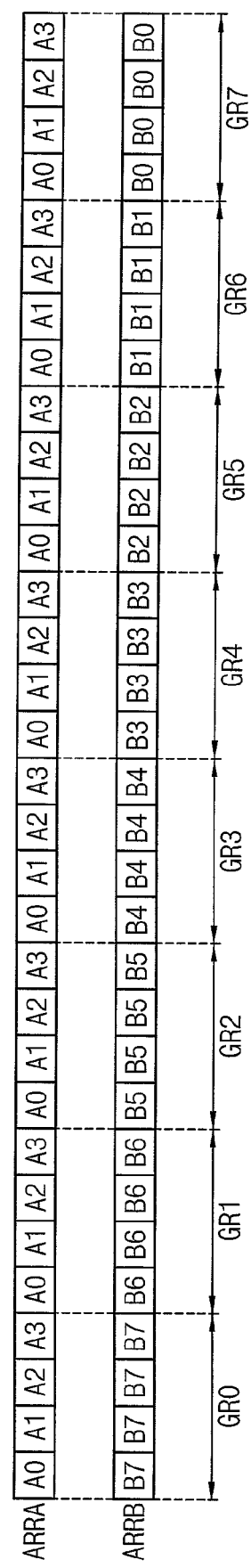

FIG. 19D illustrates an embodiment whereby the multiplicand arrangement bits ARRA are generated by the second copy and arrangement scheme SCH2 in ascending order, and the multiplier arrangement bits ARRB are generated by the first copy and arrangement scheme SCH1 in descending order.

Figure 19E:
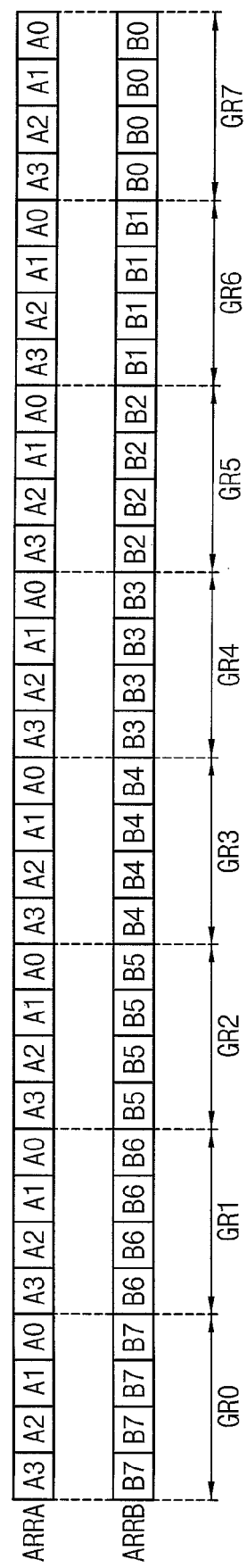

FIG. 19E illustrates an embodiment whereby the multiplicand arrangement bits ARRA are generated by the second copy and arrangement scheme SCH2 in descending order, and the multiplier arrangement bits ARRB are generated by the first copy and arrangement scheme SCH1 in descending order.

Figure 20:
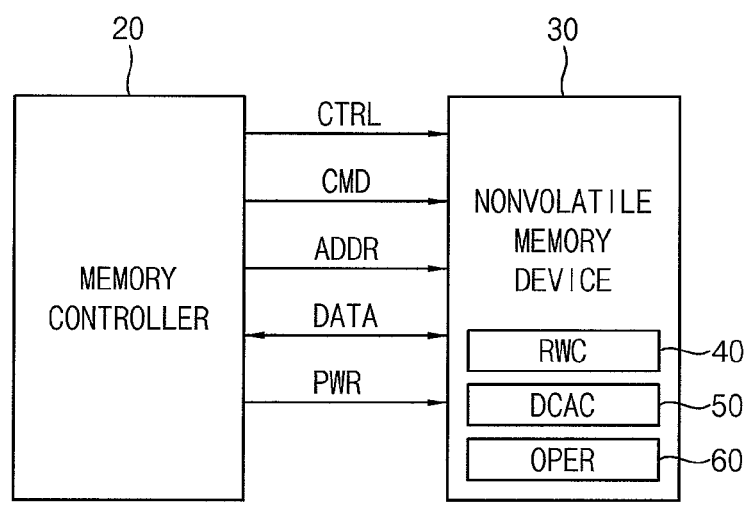
FIG. 20 illustrates a block diagram of a memory system according to embodiments of the inventive concepts.

FIG. 20 illustrates a block diagram of a memory system according to embodiments of the inventive concepts.

Referring to FIG. 20, a memory system 10 includes a memory controller 20 and at least one memory device 30.

The memory device 30 may be a nonvolatile memory device and the memory system 10 may include data storage media based on flash memory such as for example a memory card, universal serial bus (USB) memory, solid state drive (SSD), and the like.

The nonvolatile memory device 30 may perform a read operation, an erase operation, a program operation, and/or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. Also, the nonvolatile memory device 30 receives power PWR from the memory controller 20 through a power line.

The nonvolatile memory device 30 includes a read-write circuit RWC (40), a data copy and arrangement circuit DCAC 50 and an operation circuit OPER 60, which taken together are configured to perform a scalar multiplication method as described previously and a matrix multiplication method as will be described hereinafter. For example, the OPER circuit 60 may include structure and functionality of the weighted adder as described with reference to FIG. 10 to perform a scalar multiplication.

Figure 21:
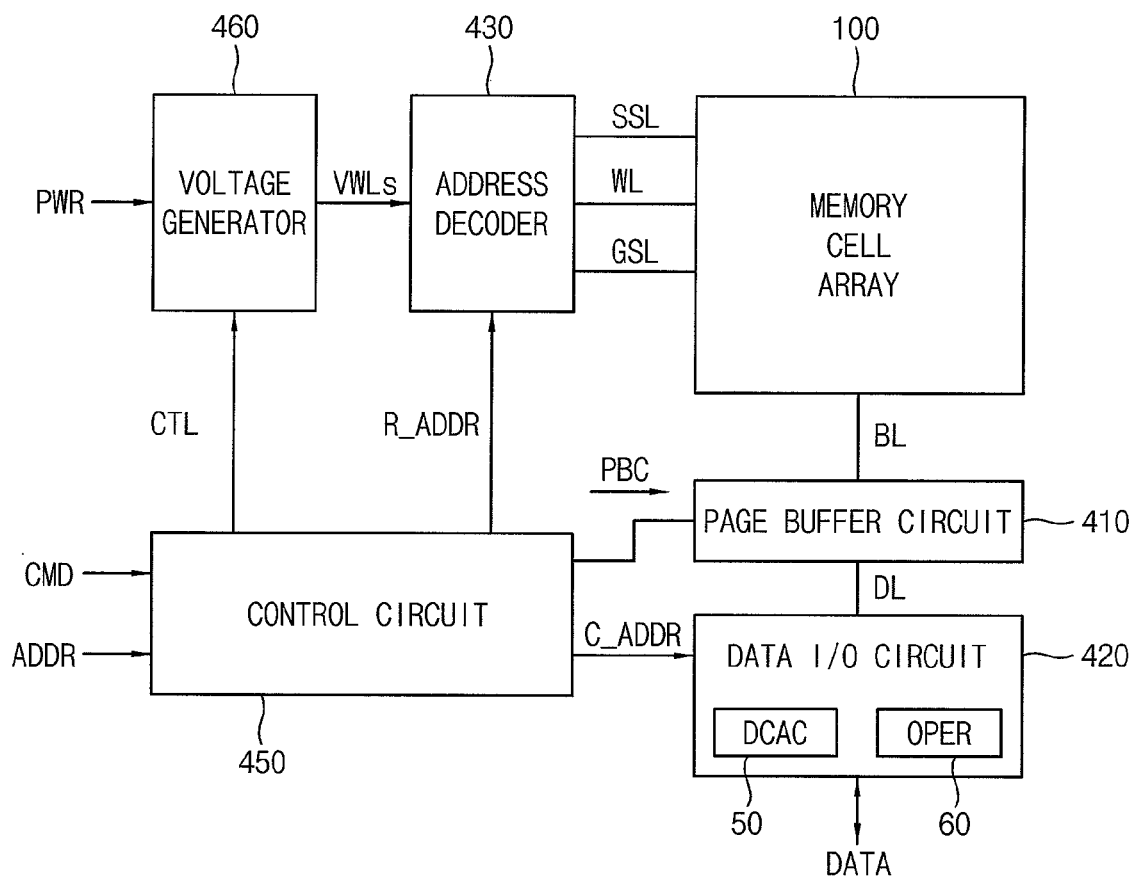
FIG. 21 illustrates a block diagram of a nonvolatile memory device according to embodiments of the inventive concepts.

FIG. 21 illustrates a block diagram of a nonvolatile memory device according to example embodiments.

Referring to FIG. 21, the nonvolatile memory device 30 includes a memory cell array 100, a page buffer circuit 410, a data input/output (I/O) circuit 420, an address decoder 430, a control circuit 450 and a voltage generator 460.

The memory cell array 100 may be coupled to the address decoder 430 through a plurality of string selection lines SSL, a plurality of word lines WL, and a plurality of ground selection lines GSL. In addition, the memory cell array 100 may be coupled to the page buffer circuit 410 through a plurality of bit lines BL.

The memory cell array 100 may include a plurality of memory cells coupled to the plurality of word lines WL and the plurality of bit lines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command (signal) CMD and an address (signal) ADDR from the memory controller 20 (see FIG. 20). The control circuit 450 may control erasure, programming and read operations of the nonvolatile memory device 30 based on the command signal CMD and the address signal ADDR. An erasure operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 450 may generate the control signals CTL which are used for controlling the voltage generator 460, and may generate the page buffer control signal PBC for controlling the page buffer circuit 410, based on the command signal CMD. The control circuit 450 may further generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of word lines WL, and the plurality of ground selection lines GSL. During a program operation or a read operation, the address decoder 430 may determine one of the plurality of word lines WL as a selected word line and determine the rest of the plurality of word lines WL other than the selected word line, as unselected word lines, based on the row address R_ADDR.

In addition, during the program operation or the read operation, the address decoder 430 may determine one of the plurality of string selection lines SSL as a selected string selection line and determine the rest of the plurality of string selection lines SSL other than the selected string selection line as unselected string selection lines based on the row address R_ADDR.

The voltage generator 460 may generate word line voltages VWLs, which may be needed for the operation of the memory cell array 100 of the nonvolatile memory device 30, based on the control signals CTL. The voltage generator 460 may receive power PWR from the memory controller 20. The word line voltages VWLs may be applied to the plurality of word lines WL through the address decoder 430.

The page buffer circuit 410 may be coupled to the memory cell array 100 through the plurality of bit lines BL. The page buffer circuit 410 may include a plurality of buffers. In some example embodiments, each buffer may be connected to one bit line. In other example embodiments, each buffer may be connected to two or more bit lines.

The page buffer circuit 410 may temporarily store data to be programmed in a selected page, or data read out from the selected page of the memory cell array 100.

The data input/output circuit 420 may be coupled to the page buffer circuit 410 through data lines DL. During the program operation, the data input/output circuit 410 may receive program data DATA received from the memory controller 20, and provide the program data DATA to the page buffer circuit 410 based on the column address C_ADDR received from the control circuit 450. During the read operation, the data input/output circuit 420 may provide read data DATA read from the memory cell array 100 and stored in the page buffer circuit 410, to the memory controller 20 based on the column address C_ADDR received from the control circuit 450.

The nonvolatile memory device 30 may include a data copy and arrangement circuit DCAC 50 and an operation circuit OPER 60 that performs a PIM method using the page buffer circuit 410 according to example embodiments. The above-described read-write circuit may correspond to the page buffer circuit 410, and the read-write unit circuits included in the read-write circuit may correspond to the page buffers included in the page buffer circuit 410. The data copy and arrangement circuit 50 and the operation circuit 60 may be included in the data input/output circuit 420, or may be implemented as additional components distinct from the data input/output circuit 420.

The data copy and arrangement circuit 50 may generate multiplicand arrangement bits by copying and arranging multiplicand bits of multiplicand values included in a multiplicand matrix. Also the data copy and arrangement circuit 50 may generate multiplier arrangement bits by copying and arranging multiplier bits of multiplier values included in a multiplier matrix.

The page buffers included in the page buffer circuit 410 are connected to bitlines. The page buffers may store the multiplier arrangement bits, receive the multiplicand arrangement bits selectively read from the memory cells based on the multiplier arrangement bits stored in the read-write unit circuits, and store multiplication bits corresponding to bitwise multiplied values of the multiplicand arrangement bits and the multiplier arrangement bits.

The operation circuit 60 may determine component values of a multiplication matrix corresponding to a multiplication of the multiplicand matrix and the multiplier matrix based on based on the multiplication bits stored in the page buffers.

Figure 22A:
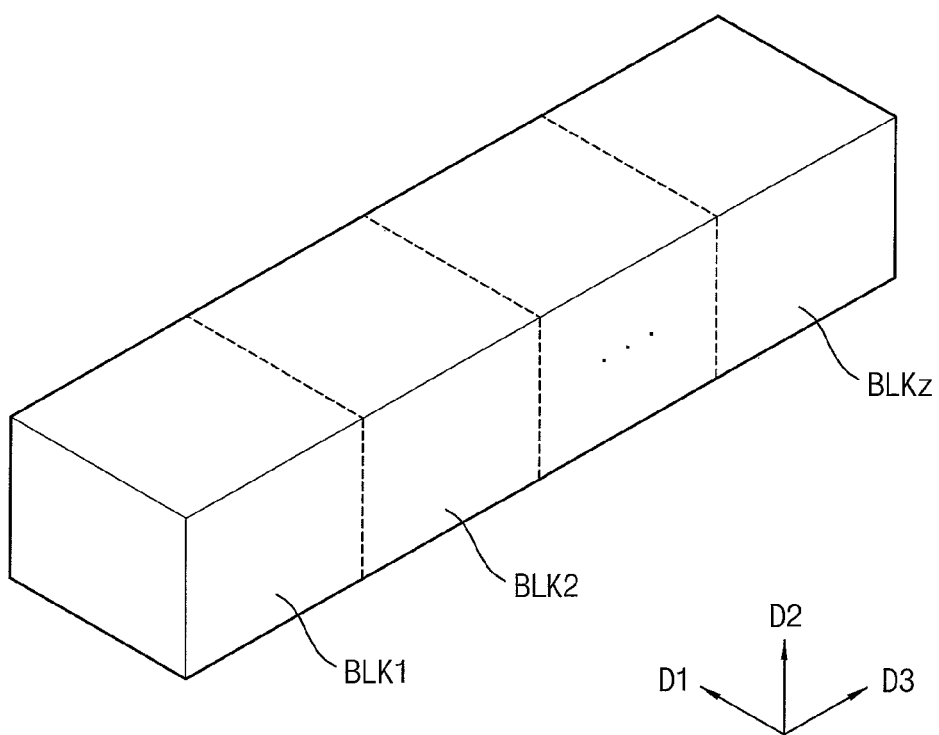
FIG. 22A illustrates a block diagram of a memory cell array included in the nonvolatile memory device of FIG. 21.
Figure 22B:
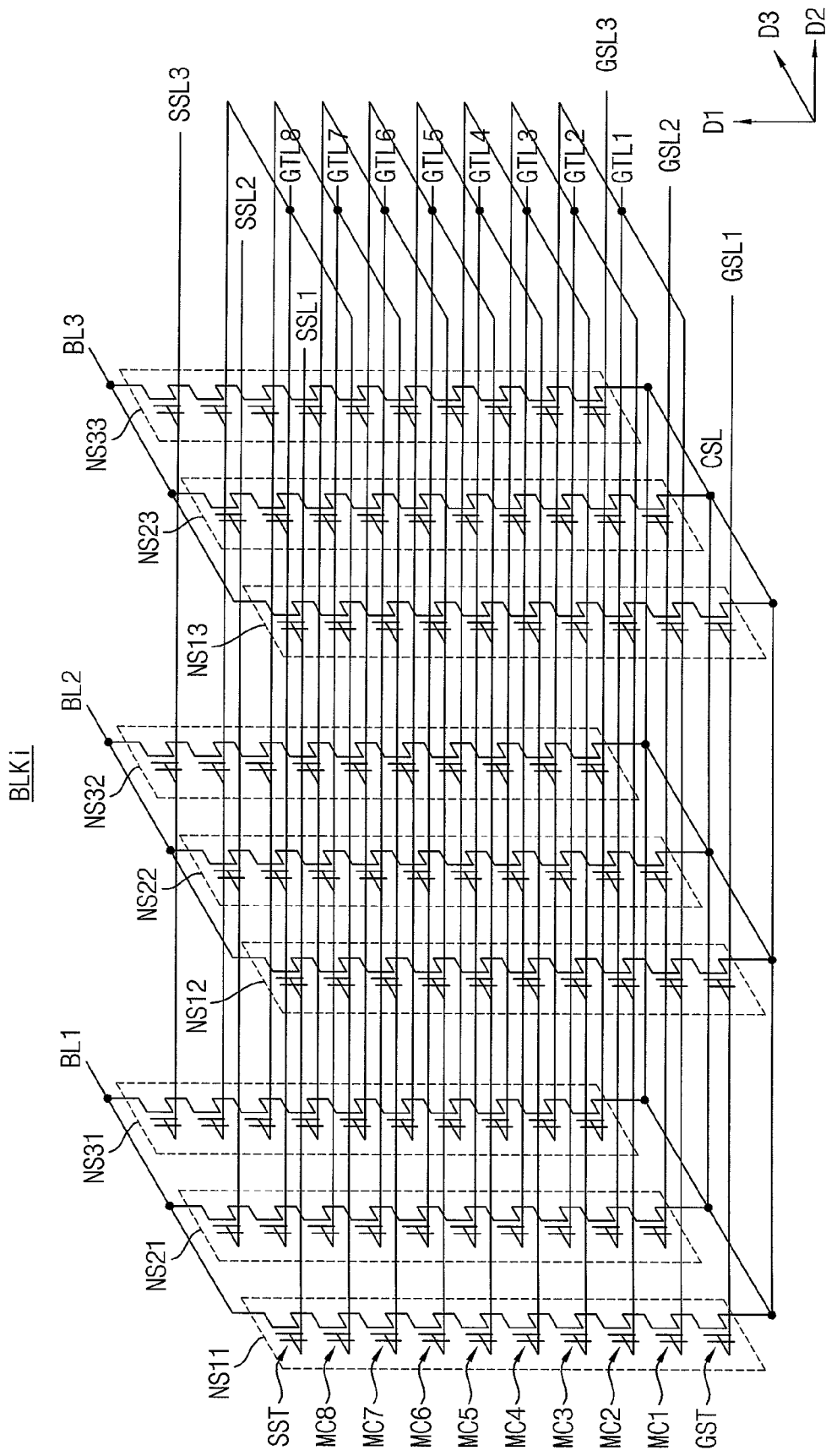
FIG. 22B illustrates a circuit diagram of an equivalent circuit of the memory block described with reference to FIG. 22A.

FIG. 22A illustrates a block diagram of a memory cell array included in the nonvolatile memory device of FIG. 21. FIG. 22B illustrates a circuit diagram of an equivalent circuit of the memory block described with reference to FIG. 22A.

Referring to FIG. 22A, the memory cell array 100 may include a plurality of memory blocks BLK1, BLK2, ..., and BLKz (i.e., BLK1 to BLKz). In some example embodiments, the memory blocks BLK1 to BLKz are selected by the address decoder 430 in FIG. 21. For example, the address decoder 430 may select a particular memory block BLK corresponding to a block address among the memory blocks BLK1 to BLKz.

The memory block BLKi of FIG. 22B may be formed on a substrate in a three-dimensional structure (or a vertical structure). For example, a plurality of NAND strings or cell strings included in the memory block BLKi may be formed in the first direction DI perpendicular to the upper surface of the substrate.

Referring to FIG. 22B, the memory block BLKi may include NAND strings NS11, NS12, NS13, NS21, NS22, NS23, NS31, NS32 and NS33 (i.e., NS11 to NS33) coupled between bit lines BL, BL2 and BL3 and a common source line CSL. Each of the NAND strings NS11 to NS33 may include a string selection transistor SST, a plurality of memory cells MC1, MC2, MC3, ..., and MC8 (i.e., MC1 to MC8), and a ground selection transistor GST. In FIG. 22B, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1, SSL2, and SSL3). The plurality of memory cells MC1 to MC8 may be connected to corresponding gate lines GTL1, GTL2, GT3, ..., and GTL8 (i.e., GTL1 to GTL8), respectively. The gate lines GTL1 to GTL8 may be word lines and some of the gate lines GTL1 to GTL8 may be dummy word lines. Each ground selection transistor GST may be connected to a corresponding ground selection line (one of GSL1, GSL2, and GSL3). Each string selection transistor SST may be connected to a corresponding bit line (e.g., one of BL, BL2 and BL3), and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated. Even though not illustrated, the gate lines corresponding to the intermediate switching lines may be separated as will be described hereinafter. In FIG. 22B, the memory block BLKi is illustrated to be coupled to eight gate lines GTL1 to GTL8 and three bit lines BL1 to BL3. However, example embodiments are not limited thereto. Each memory block in the memory cell array 100 may be coupled to any number of word lines and any number of bit lines.

Figure 23:
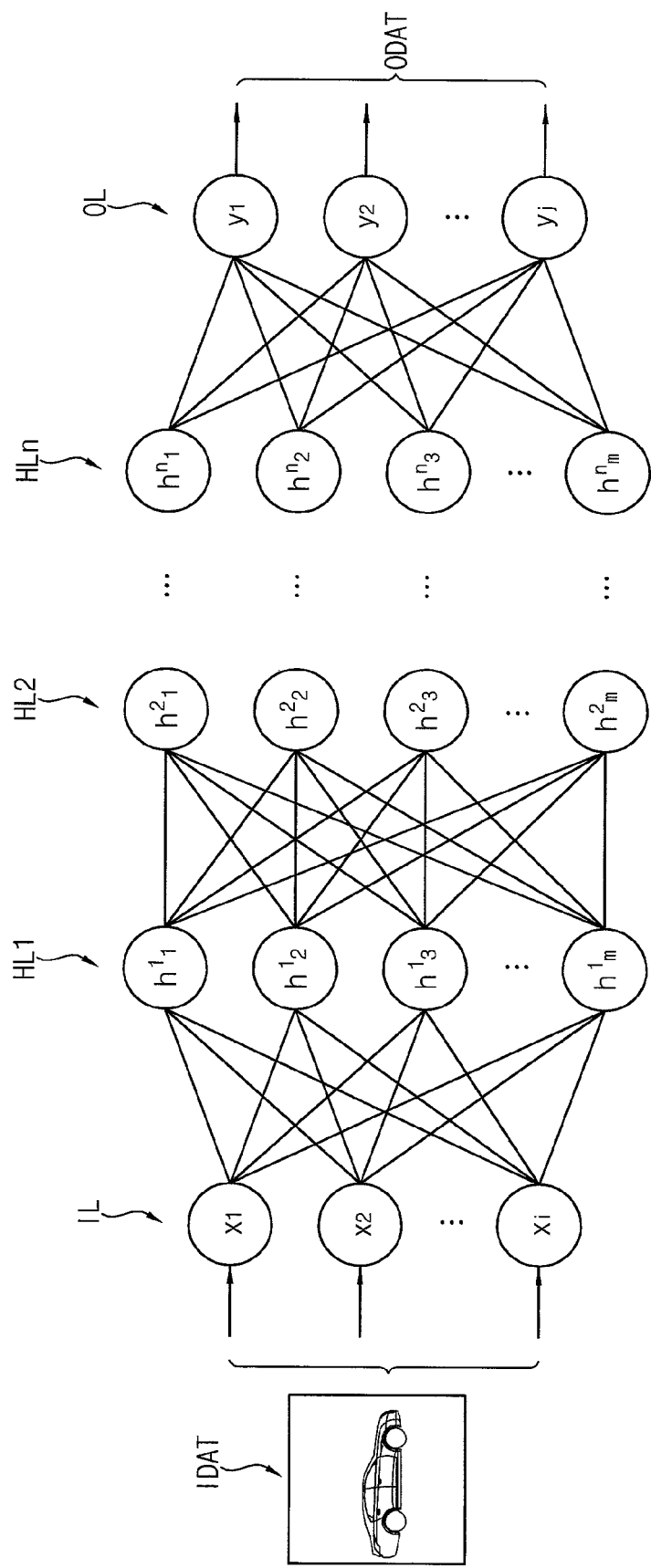
FIG. 23 illustrates a diagram descriptive of an example of a deep learning neural network structure that is driven by an artificial neural network (ANN) system using a memory device according to one or more embodiments of the inventive concepts.

FIG. 23 illustrates a diagram descriptive of an example of a deep learning neural network structure that is driven by an artificial neural network (ANN) system using a memory device according to one or more embodiments of the inventive concepts.

Referring to FIG. 23, a general neural network may include an input layer IL, a plurality of hidden layers HL1, HL2, ..., HLn and an output layer OL.

The input layer IL may include i input nodes x1, x2, ..., xi, where i is a natural number. Input data (e.g., vector input data) IDAT whose length is i may be input to the input nodes x1, x2, ..., xi such that each element of the input data IDAT is input to a respective one of the input nodes x1, x2, ..., xi.

The plurality of hidden layers HL1, HL2, ..., HLn may include n hidden layers, where n is a natural number, and may include a plurality of hidden nodes $h^1 1$, $h^1 2$, $h^1 3$, ..., $h^1 m$, $h^2 1$, $h^2 2$, $h^2 3$, ..., $h^2 m$, $h''1$, $h''2$, $h''3$, ..., hem. For example, the hidden layer HL1 may include m hidden nodes $h^1 1$, $h^1 2$, $h^1 3$, ..., $h^1 m$, the hidden layer HL2 may include m hidden nodes $h^2 1$, $h^2 2$, $h^2 3$, ..., $h^2 m$, and the hidden layer HLn may include m hidden nodes $h''1$, $h''2$, $h''3$, ..., hem, where m is a natural number.

The output layer OL may include j output nodes y1, y2, ..., yj, where j is a natural number. Each of the output nodes y1, y2, ..., yj may correspond to a respective one of classes to be categorized. The output layer OL may output the output values ODAT (e.g., class scores or simply scores) associated with the input data IDAT for each of the classes. The output layer OL may be referred to as a fully-connected layer and may indicate, for example, a probability that the input data IDAT corresponds to a car.

A structure of the neural network illustrated in FIG. 23 may be represented by information on branches (or connections) between nodes illustrated as lines, and a weighted value assigned to each branch. Nodes within one layer may not be connected to one another, but nodes of different layers may be fully or partially connected to one another.

Each node (e.g., the node $h^1 1$) may receive an output of a previous node (e.g., the node x1), may perform a computing operation, computation or calculation on the received output, and may output a result of the computing operation, computation or calculation as an output to a next node (e.g., the node $h^2 1$). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer is referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 23 may not be suitable for handling input image data (or input sound data) because each node (e.g., the node $h^1 1$) is connected to all nodes of a previous layer (e.g., the nodes x1, x2, . . . , xi included in the layer IL), and then the number of weighted values drastically increases as the size of the input image data increases. Thus, a convolutional neural network (CNN), which is implemented by combining a filtering technique with the general neural network, has been researched such that two-dimensional image (e.g., the input image data) is efficiently trained by the convolutional neural network.

As such, the deep learning neural network structure may include a plurality of layers, and a matrix multiplication and/or a matrix-vector multiplication may be required with respect to each layer.

FIG. 24 illustrates a diagram of an example of a matrix multiplication.

As illustrated in FIG. 24, (i, k) each of p*r*q (i, k, j) multiplication values Wik*Xkj may be determined by multiplying a multiplicand value Wik included in a multiplicand matrix MW of p rows and r columns and a (k, j) multiplier value Mkj included in a multiplier matrix of r rows and q columns, with respect to all of i, k and j where i is a natural number from 1 to p, k is a natural number from 1 to r and j is a natural number from 1 to q.

Each of p*q (i, j) component values Yij included in a multiplication matrix MY of p rows and q columns corresponding to a multiplication of the multiplicand matrix MW and the multiplier matrix MX may be determined by summing the r (i, k, j) multiplication values Wik*Xkj with respect to all of k.

The determination of the p*r*q (i, k, j) multiplication values Wik*Xkj corresponds to the scalar multiplication, and thus the determination of each multiplication value may be performed by the method as described with reference to FIGS. 1 through 18.

Figure 25:
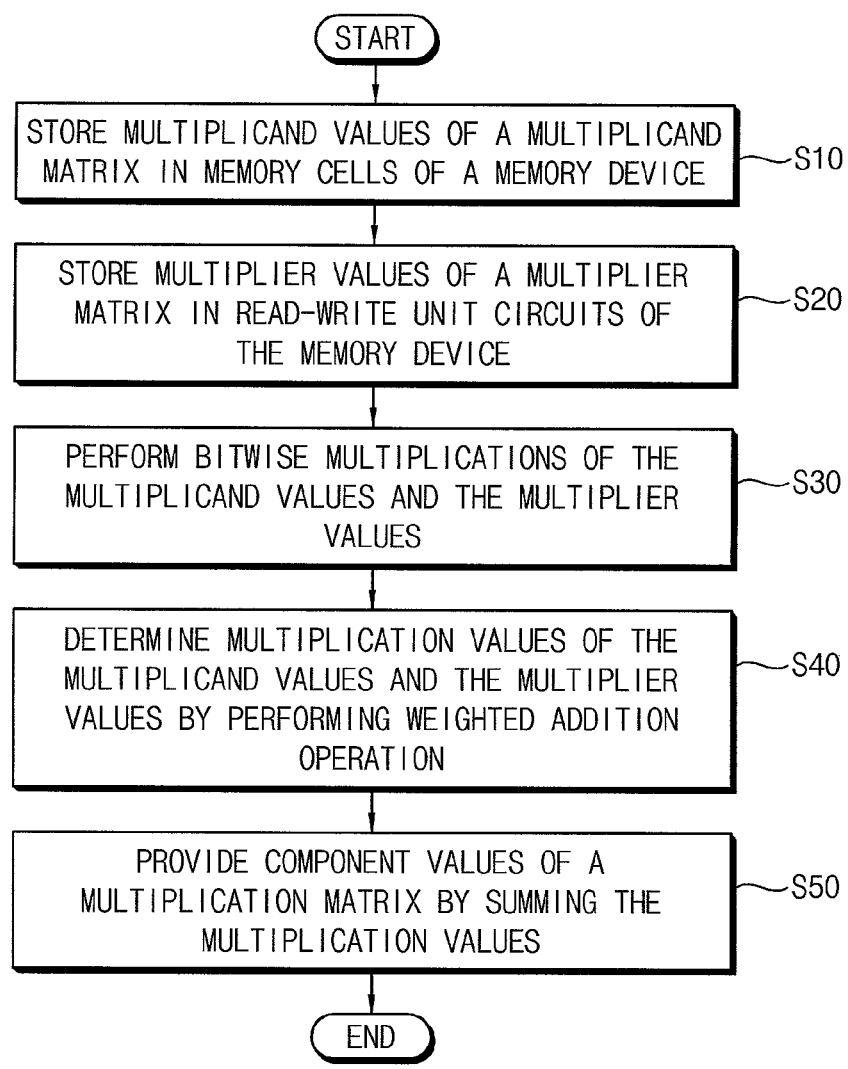
FIG. 25 illustrates a flow chart of a matrix multiplication method using a memory device according to embodiments of the inventive concepts.
Figure 26:
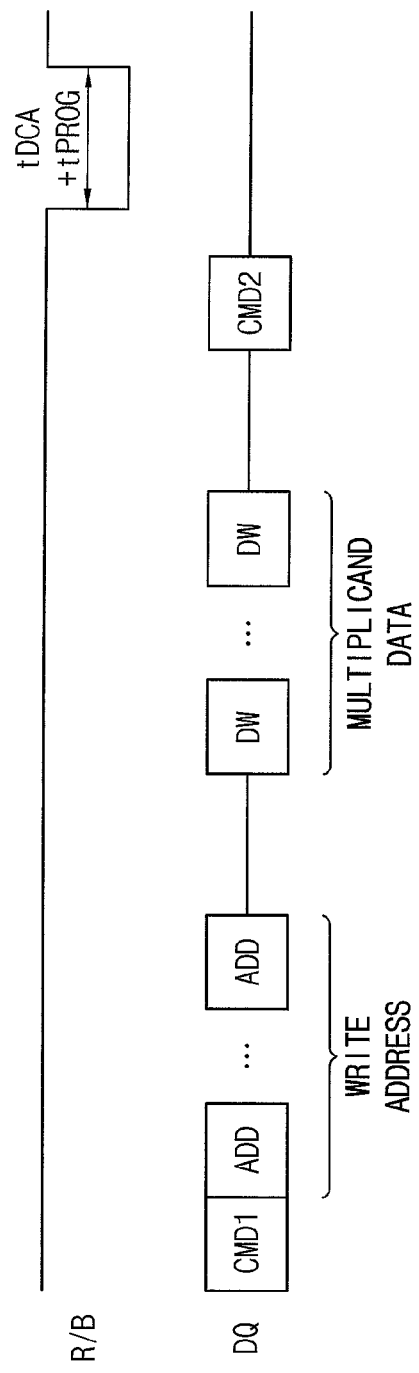
FIG. 26 illustrates command sets for a matrix multiplication method using a memory device according to embodiments of the inventive concepts.
Figure 27:
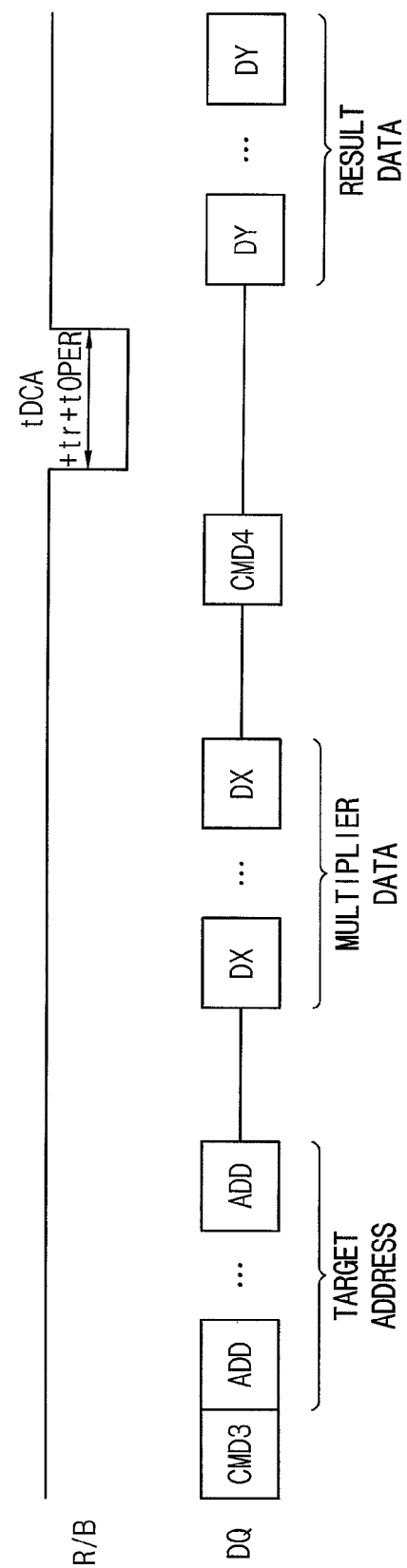
FIG. 27 illustrates command sets for a matrix multiplication method using a memory device according to embodiments of the inventive concepts.

FIG. 25 illustrates a flow chart of a matrix multiplication method using a memory device according to embodiments of the inventive concepts. FIGS. 26 and 27 illustrate diagrams of command sets for a matrix multiplication method using a memory device according to embodiments of the inventive concepts.

The matrix multiplication as illustrated in FIG. 24 may be performed using a memory device, which performs a read operation and a write operation with respect to memory cells connected to bitlines using read-write unit circuits connected to the bitlines.

Referring to FIGS. 24 and 25, the multiplicand values W11~Wpr of the multiplicand matrix MW are stored in memory cells of a memory device (S10). The memory cells may for example correspond to memory cells within memory cell array 100 of the nonvolatile memory device 30 as shown in FIG. 21. After that, the multiplier values X11~Xrq of the multiplier matrix MX are stored in read-write unit circuits of the memory device (S20). The read-write circuits may for example correspond to buffers included in page buffer circuit 410 as shown in FIG. 21. As described previously, the multiplicand arrangement bits may be stored in the memory cells by copying and arranging multiplicand bits of each multiplicand value, and the multiplier arrangement bits may be stored in the read-write unit circuits by copying and arranging the multiplier bits of each multiplier value.

The multiplicand values W11~Wpr included in the multiplicand matrix MW may correspond to weight values of a multiplication and accumulation (MAC) operation performed by an artificial neural network (ANN) as described with reference to FIG. 23, and the multiplier values X11~Xrq included in the multiplier matrix MX may correspond to input values of the MAC operation.

FIGS. 26 and 27 illustrate command sets provided from a memory controller (e.g., memory controller 20 shown in FIG. 20) to a memory device (e.g., nonvolatile memory device 30 shown in FIG. 20) to transfer multiplicand data DW and multiplier data DX for a matrix multiplication. R/B indicates a ready/busy signal provided from the memory device to the memory controller, and DQ indicates input-output signals transferred through the input-output pads between the memory controller and the memory device. The command set may be implemented as a combination of commands CMD1~CMD4, addresses ADD and transferred data DW and DX. tDCA indicates a time required for the above-described data rearrangement, tPROG indicates a time for storing data in the memory cells, tR indicates a data read time, tOPER indicates a time required for the weighted addition operations by the weighted adders and data accumulation by accumulators as will be described below with reference to FIGS. 28 and 29.

According to example embodiments, the multiplicand data may be stored in the memory cells corresponding to a write address by the command set of FIG. 26. After that, the multiplier data may be stored in the page buffers corresponding to a target address by the command set of FIG. 27. Bitwise multiplications of the multiplicand values and the multiplier values are then performed (S30). The bitwise multiplications may be performed by the above-described selection read operation SRO, the resulting multiplication bits may be stored in the read-write unit circuits such as the page buffers.

The multiplication values of the multiplicand values and the multiplier values are then determined by performing weighted addition operation (S40). The determination of the multiplication values may be performed using the above-described weighted adders by reading out the multiplication bits by unit of groups.

Component values of a multiplication matrix are provided by summing the multiplication values (S50). The multiplication may be summed or accumulated using accumulators as will be described hereinafter with reference to FIGS. 28 and 29.

Figure 28:
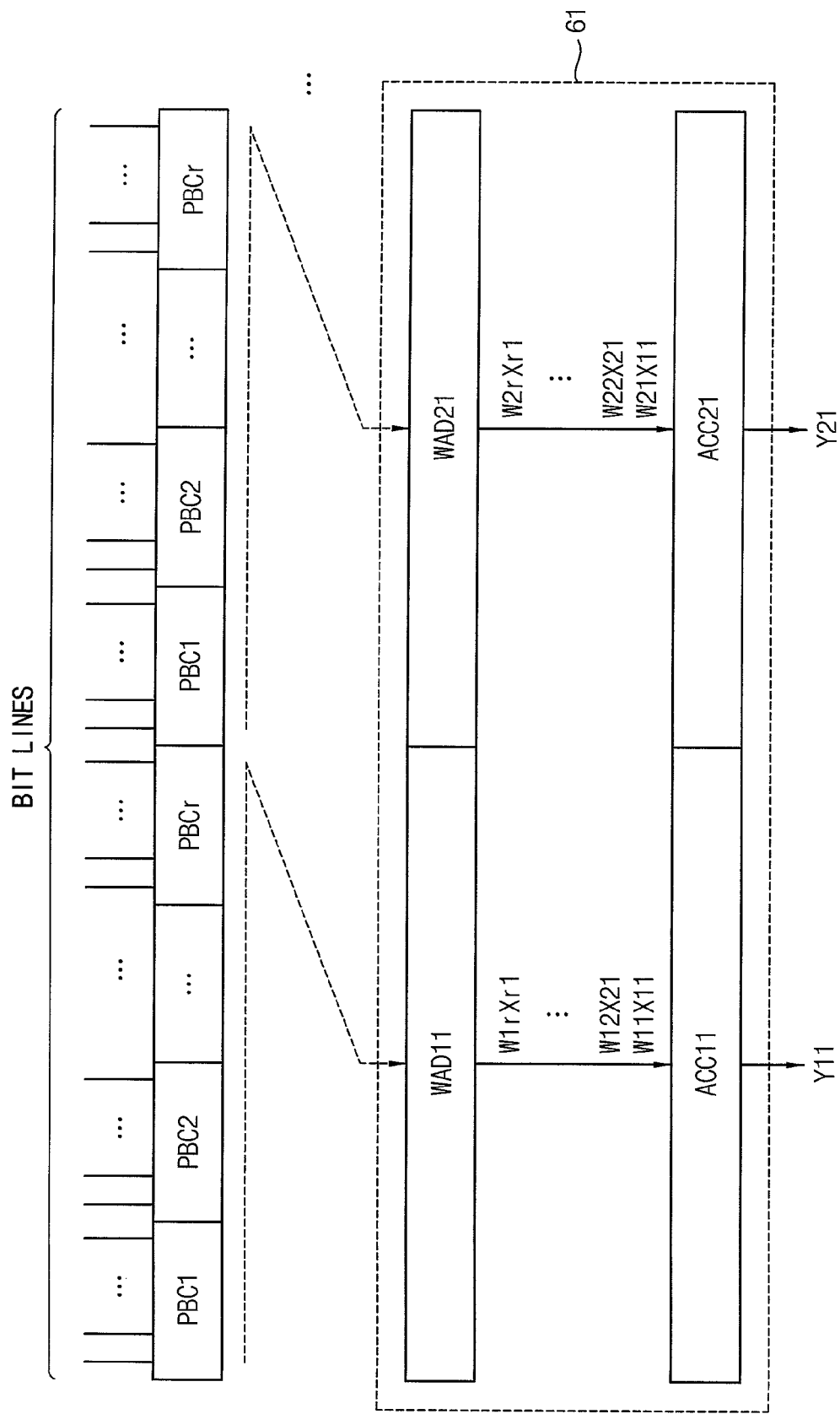
FIG. 28 illustrates a diagram of an operation circuit included in a memory device according to embodiments of the inventive concepts.
Figure 29:
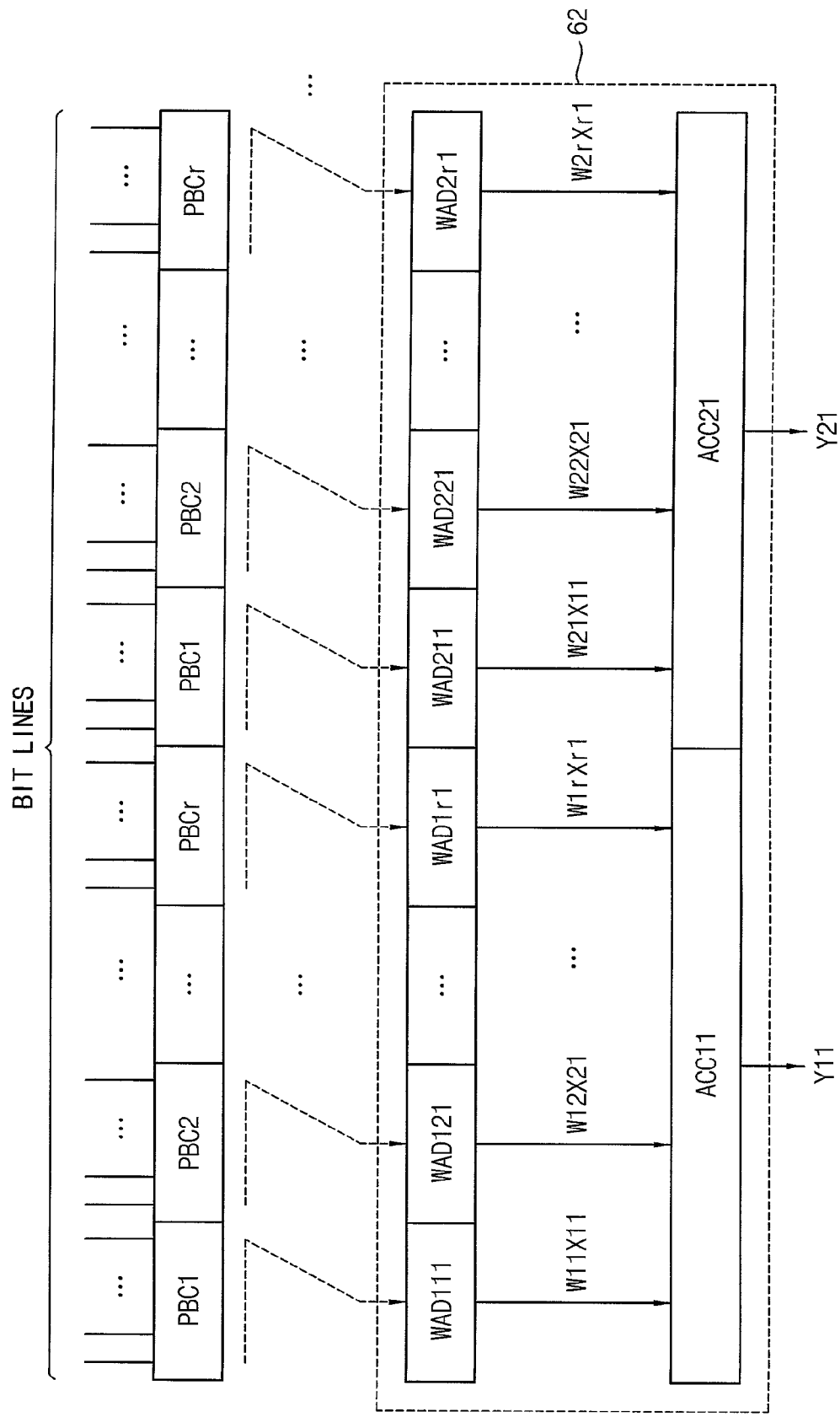
FIG. 29 illustrates a diagram of an operation circuit included in a memory device according to embodiments of the inventive concepts.

FIGS. 28 and 29 illustrate diagrams of embodiments of an operation circuit 60 included in a memory device according to embodiments of the inventive concepts.

In FIGS. 28 and 29, r sub page buffer circuits PBC1, PBC2, . . . , and PBCr (i.e., PBC1~PBCr) are arranged repeatedly. The r sub page buffer circuits PBC1~PBCr correspond to one component value Yij of the multiplication matrix MY that is the result of the matrix multiplication of FIG. 24. For convenience of illustration, FIGS. 28 and 29 illustrate configurations corresponding to the two component values Y11 and Y21.

Referring to FIG. 28, an operation circuit 61 includes a plurality of weighted adders WAD11 and WAD21 and a plurality of accumulators ACC11 and ACC21.

The r (i, k, j) multiplication values Wi1*X1j~Wir*Xrj with respect to each of i and each of j are sequentially determined using one weighted adder included in the memory device. In other words, the r multiplication values W11*X11~W1r*Xr1 are sequentially determined using the weighted adder WAD11, and the r multiplication values W21*X11~W2r*Xr1 are sequentially determined using the weighted adder WAD21.

The p*q (i, j) component values Y11~Ypq are determined in parallel using p*q accumulators included in the memory device. For example, as illustrated in FIG. 28, the two component values Y11 and Y21 are determined in parallel using the two accumulators ACC11 and ACC21.

Referring to FIG. 29, an operation circuit 62 includes a plurality of weighted adders WAD111, WAD121, . . . , and WAD1r1 (i.e., WAD111~WAD1rq) and WAD211, WAD221, . . . , and WAD2r1 (i.e., WAD211-WAD2r1) and a plurality of accumulators ACC11 and ACC21.

The r (i, k, j) multiplication values Wi1*X1j~Wir*Xrj with respect to each of i and each of j are determined in parallel using r weighted adders included in the memory device. In other words, the r multiplication values W11*X11~W1r*Xr1 are determined in parallel using the r weighted adders WAD111~WAD1r1, and the r multiplication values W21*X11~W2r*Xr1 are determined in parallel using the r weighted adders WAD211~WAD2r1.

The p*q (i, j) component values Y11~Ypq are determined in parallel using p*q accumulators included in the memory device. For example, as illustrated in FIG. 29, the two component values Y11 and Y21 are determined in parallel using the two accumulators ACC11 and ACC21.

Figure 30:
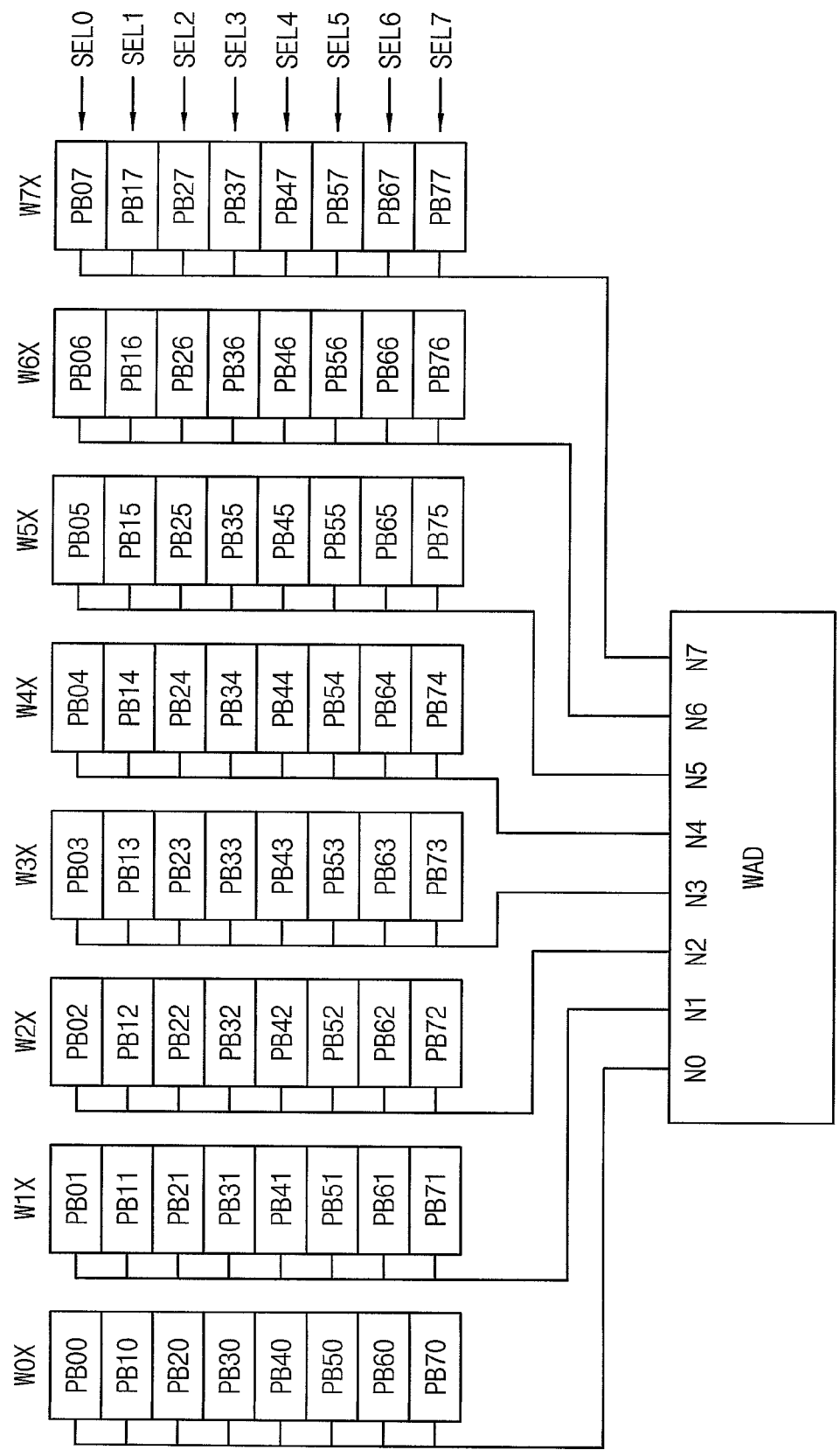
FIG. 30 illustrates a diagram of page buffers included in a memory device according to embodiments of the inventive concepts.

FIG. 30 illustrates a diagram of an arrangement of page buffers included in a memory device according to embodiments of the inventive concepts.

Referring to FIG. 30, a plurality of read-write unit circuits (e.g., a plurality of page buffers) may be disposed in a matrix form of rows and columns. As shown, 64 page buffers PBij are included with each of i and j being an integer from 0 to 7. The 64 page buffers PBij respectively correspond to one multiplication value W*X for an example case that a multiplicand value W includes eight multiplicand bits W0~W7 and also a multiplier value X includes eight bits.

As illustrated in FIG. 30, the page buffers disposed in the same column are connected commonly to the same input terminal of the weighted adder WAD included in the operation circuit In other words, the page buffers PB00~PB70 disposed in the first column are connected to the first input terminal N0 of the weighted adder WAD, the page buffers PB01~PB71 disposed in the second column are connected to the second input terminal NI of the weighted adder WAD, and so on, so that in this way the page buffers PB07~PB77 disposed in the eighth column are connected to the eighth input terminal N7 of the weighted adder WAD.

The page buffers in the same row are enabled simultaneously by a common selection signal to simultaneously provide the stored values to the input terminals of the weighted adder WAD. In other words, the eight page buffers PB00~PB07 disposed in the first row are enabled simultaneously in response to a first selection signal SEL0, the eight page buffers PB10~PB17 disposed in the second row are enabled simultaneously in response to a second selection signal SEL1, and so on, so that in this way the eight page buffers PB70~PB77 disposed in the eighth row are enabled simultaneously in response to an eighth selection signal SEL7.

As such, using the wired-OR structure of FIG. 30, the above-described weighted addition operations may be performed efficiently.

Figure 31:
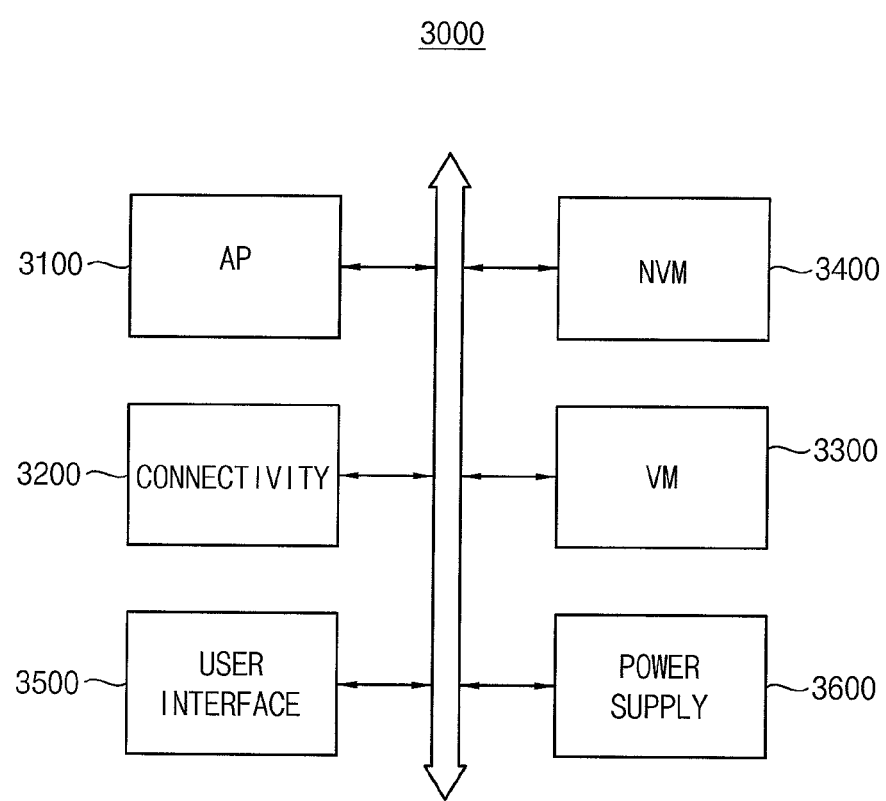
FIG. 31 illustrates a block diagram of a mobile system including a memory device according to embodiments of the inventive concepts.

FIG. 31 illustrates a block diagram of a mobile system including a memory device according to embodiments of the inventive concepts.

Referring to FIG. 31, a mobile system 3000 includes an application processor (AP) 3100, a connectivity unit 3200, a volatile memory device (VM) 3300, a nonvolatile memory device (NVM) 3400, a user interface 3500, and a power supply 3600 connected via a bus.

The application processor 3100 may execute applications such as for example a web browser, a game application, a video player, or the like. The connectivity unit 3200 may perform wired or wireless communication with an external device. The volatile memory device 3300 may store data processed by the application processor 3100, or may operate as a working memory. For example, the volatile memory device 3300 may include DRAM, such as double data rate synchronous dynamic random access memory (DDR SDRAM), low power DDR (LPDDR) SDRAM, graphics DDR (GDDR) SDRAM, Rambus DRAM (RDRAM®), or the like. The nonvolatile memory device 3400 may store a boot image for booting the mobile system 3000 and other data. The user interface 3500 may include at least one input device such as for example a keypad, a touch screen, or the like, and at least one output device such as for example a speaker, a display device, or the like. The power supply 3600 may supply a power supply voltage to the mobile system 3000. In embodiments of the inventive concepts, the mobile system 3000 may further include a camera image processor (CIS), and/or a storage device, such as a memory card, a solid state drive (SSD), a hard disk drive (HDD), a compact disc read only memory (CD-ROM), or the like.

The nonvolatile memory device 3400 and/or the volatile memory device 3300 may include configurations for performing the scalar multiplication or the matrix multiplication as described with reference to FIGS. 1 through 30.

As described above, the memory device and the processing in memory (PIM) method according to embodiments of the inventive concepts may reduce processing time and power consumption by efficiently performing the parallel bitwise multiplications through the efficient rearrangement of data using the read-write circuit included in the memory device.

The inventive concepts may be applied to memory devices and systems including the memory devices. For example, embodiments of the inventive concepts may be applied to systems such as memory cards, solid state drives (SSDs), embedded multimedia cards (eMMCs), mobile phones, smart phones, personal digital assistants (PDAs), portable multimedia players (PMPs), digital cameras, camcorders, personal computers (PCs), server computers, workstations, laptop computers, digital TVs, set-top boxes, portable game consoles, navigation systems, wearable devices, internet of things (IoT) devices, internet of everything (IoE) devices, e-books, virtual reality (VR) devices, augmented reality (AR) devices, or the like.

The foregoing is illustrative of example embodiments and is not to be construed as limiting thereof. Although a few example embodiments have been described, those skilled in the art should readily appreciate that many modifications are possible to the example embodiments without materially departing from the present inventive concepts.

What is claimed is:

1. A processing in memory (PIM) method using a memory device, the method comprising:

storing m*n multiplicand arrangement bits in m*n memory cells of the memory device by copying and arranging m multiplicand bits of a multiplicand value where m and n are natural numbers greater than zero;

storing m*n multiplier arrangement bits in m*n read-write unit circuits of the memory device corresponding to the m*n memory cells by copying and arranging n multiplier bits of a multiplier value;

selectively sensing fewer than all of the m*n multiplicand arrangement bits stored in the m*n memory cells based on the m*n multiplier arrangement bits stored in the m*n read-write unit circuits, and storing m*n multiplication bits in the m*n read-write unit circuits based on the selectively sensed m*n multiplicand arrangement bits, the m*n multiplication bits corresponding to bitwise multiplied values of the m*n multiplicand arrangement bits and the m*n multiplier arrangement bits; and determining a multiplication value of the multiplicand value and the multiplier value based on the m*n multiplication bits stored in the m*n read-write unit circuits, wherein:

the selectively sensing the m*n multiplicand arrangement bits and the storing the m*n multiplication bits in the m*n read-write unit circuits comprise:

sensing multiplicand arrangement bits from among the m*n multiplicand arrangement bits that correspond to multiplier arrangement bits from among the m*n multiplier arrangement bits having a value of "1" from the m*n memory cells and replacing the multiplier arrangement bits having the value of "1" stored in the m*n read-write unit circuits with the sensed multiplicand arrangement bits; and maintaining multiplier arrangement bits from among the m*n multiplier arrangement bits having a value of "0" stored in the m*n read-write unit circuits regardless of values of multiplicand arrangement bits from among the m*n multiplicand arrangement bits that correspond to the multiplier arrangement bits having the value of "0".

2. The PIM method of claim 1, wherein the storing the m*n multiplication bits in the m*n read-write unit circuits comprises:

selectively precharging m*n bitlines connected to the m*n read-write unit circuits based on the m*n multiplier arrangement bits stored in the m*n read-write unit circuits; and performing a sensing operation with respect to the m*n memory cells after the m*n bitlines are selectively precharged, wherein the m*n bitlines are connected to the m*n memory cells.

3. The PIM method of claim 2, wherein the selectively precharging the m*n bitlines comprises:

precharging bitlines from among the m*n bitlines that correspond to multiplier arrangement bits from among the m*n multiplier arrangement bits having a value of "1" from an initialization voltage corresponding to a value of "0" to a precharge voltage corresponding to the value of "1"; and maintaining bitlines from among the m*n bitlines that correspond to multiplier arrangement bits from among the m*n multiplier arrangement bits having the value of "0" at the initialization voltage.

4. The PIM method of claim 1, wherein the storing the m*n multiplication bits comprises:

selectively and electrically connecting m*n bitlines to the m*n read-write unit circuits based on the m*n multiplier arrangement bits stored in the m*n read-write unit circuits; and performing a sensing operation with respect to the m*n memory cells while the m*n bitlines are selectively and electrically connected to the m*n read-write unit circuits.

5. The PIM method of claim 4, wherein the selectively and electrically connecting the m*n bitlines to the m*n read-write unit circuits comprises:

electrically connecting bitlines from among the m*n bitlines that correspond to multiplier arrangement bits from among the m*n multiplier arrangement bits having a value of "1" to corresponding read-write unit circuits of the m*n read-write unit circuits; and electrically disconnecting bitlines from among the m*n bitlines that correspond to multiplier arrangement bits from among the m*n multiplier arrangement bits having a value of "0" from corresponding read-write unit circuits of the m*n read-write unit circuits.

6. The PIM method of claim 1, wherein:

the m*n multiplicand arrangement bits are generated by a first copy and arrangement scheme such that each bit of the m multiplicand bits is copied and arranged repeatedly n times to be adjacent to each other, and the m*n multiplier arrangement bits are generated by a second copy and arrangement scheme such that the n multiplier bits are copied and arranged repeatedly m times.

7. The PIM method of claim 6, wherein the determining the multiplication value of the multiplicand value and the multiplier value comprises:

grouping the m*n multiplication bits stored in the m*n read-write unit circuits into m bit groups corresponding the m multiplicand bits;

sequentially sensing m intermediate multiplication values corresponding to the m bit groups; and determining the multiplication value by summing m weighted intermediate multiplication values, wherein each of the m weighted intermediate multiplication values is a multiplication of each of the m intermediate multiplication values and each of m bit weights corresponding to the m multiplicand bits.

8. The PIM method of claim 1, wherein:

the m*n multiplier arrangement bits are generated by a first copy and arrangement scheme such that each bit of the n multiplier bits is copied and arranged repeatedly m times to be adjacent to each other, and the m*n multiplicand arrangement bits are generated by a second copy and arrangement scheme such that the m multiplicand bits are copied and arranged repeatedly n times.

9. The PIM method of claim 8, wherein the determining the multiplication value of the multiplicand value and the multiplier value comprises:

grouping the m*n multiplication bits stored in the m*n read-write unit circuits into n bit groups corresponding the n multiplier bits;

sequentially sensing n intermediate multiplication values corresponding to the n bit groups; and determining the multiplication value by summing n weighted intermediate multiplication values, wherein each of the n weighted intermediate multiplication values is a multiplication of each of the n intermediate multiplication values and each of n bit weights corresponding to the n multiplier bits.

10. A processing in memory (PIM) method using a memory device, the method comprising:

determining each of p*r*q (i, k, j) multiplication values by multiplying a (i, k) multiplicand value included in a multiplicand matrix of p rows and r columns and a (k, j) multiplier value included in a multiplier matrix of r rows and q columns, with respect to all of i, k and j, where i is a natural number from 1 to p, k is a natural number from 1 to r, and j is a natural number from 1 to q; and determining each of p*q (i, j) component values included in a multiplication matrix of p rows and q columns corresponding to a multiplication of the multiplicand matrix and the multiplier matrix, by summing the r (i, k, j) multiplication values with respect to all of k, wherein:

determining a p*r*q (i, k, j) multiplication value of the p*r*q (i, k, j) multiplication values comprises storing m*n multiplicand arrangement bits in m*n memory cells of the memory device by copying and arranging m multiplicand bits of the (i, k) multiplicand value where m and n are natural numbers greater than zero, storing m*n multiplier arrangement bits in m*n read-write unit circuits of the memory device corresponding to the m*n memory cells by copying and arranging n multiplier bits of the (k, j) multiplier value, selectively sensing fewer than all of the m*n multiplicand arrangement bits stored in the m*n memory cells based on the m*n multiplier arrangement bits stored in the m*n read-write unit circuits, and storing m*n multiplication bits in the m*n read-write unit circuits based on the selectively read m*n multiplicand arrangement bits, the m*n multiplication bits corresponding to bitwise multiplied values of the m*n multiplicand arrangement bits and the m*n multiplier arrangement bits, and determining the p*r*q (i, k, j) multiplication value of the (i, k) multiplicand value and the (k, j) multiplier value based on the m*n multiplication bits stored in the m*n read-write unit circuits, wherein the selectively sensing the m*n multiplicand arrangement bits and the storing the m*n multiplication bits in the m*n read-write unit circuits comprise:

sensing multiplicand arrangement bits from among the m*n multiplicand arrangement bits that correspond to multiplier arrangement bits from among the m*n multiplier arrangement bits having a value of "1" from the m*n memory cells and replacing the multiplier arrangement bits having the value of "1" stored in the m*n read-write unit circuits with the sensed multiplicand arrangement bits; and maintaining multiplier arrangement bits from among the m*n multiplier arrangement bits having a value of "0" stored in the m*n read-write unit circuits regardless of values of multiplicand arrangement bits from among the m*n multiplicand arrangement bits that correspond to the multiplier arrangement bits having the value of "0".

11. The PIM method of claim 10, wherein the r (i, k, j) multiplication values with respect to each of i and each of j are sequentially determined using one weighted adder included in the memory device.

12. The PIM method of claim 10, wherein the r (i, k, j) multiplication values with respect to each of i and each of j are determined in parallel using r weighted adders included in the memory device.

13. The PIM method of claim 10, wherein the p*q (i, j) component values are determined in parallel using p*q accumulators included in the memory device.

14. A memory device comprising:
a data copy-arrangement circuit configured to generate multiplicand arrangement bits by copying and arranging multiplicand bits of multiplicand values included in a multiplicand matrix and to generate multiplier arrangement bits by copying and arranging multiplier bits of multiplier values included in a multiplier matrix;

a memory cell array including memory cells connected to bitlines and configured to store the multiplicand arrangement bits;

read-write unit circuits connected to the bitlines and configured to:
store the multiplier arrangement bits,
receive the multiplicand arrangement bits selectively sensed from fewer than all of the memory cells based on the multiplier arrangement bits stored in the read-write unit circuits, and
store multiplication bits based on the multiplicand arrangement bits selectively sensed from the memory cells, the multiplication bits corresponding to bitwise multiplied values of the multiplicand arrangement bits and the multiplier arrangement bits;

a control circuit configured to selectively sense the multiplicand arrangement bits by:
sensing multiplicand arrangement bits from among the multiplicand arrangement bits that correspond to multiplier arrangement bits from among the multiplier arrangement bits having a value of "1" from the memory cells, and replacing the multiplier arrangement bits having the value of "1" stored in the read-write unit circuits with the sensed multiplicand arrangement bits, and
maintaining multiplier arrangement bits from among the multiplier arrangement bits having a value of "0" stored in the read-write unit circuits regardless of values of multiplicand arrangement bits from among the multiplicand arrangement bits that correspond to the multiplier arrangement bits having the value of "0"; and an operation circuit configured to determine component values of a multiplication matrix corresponding to a multiplication of the multiplicand matrix and the multiplier matrix based on the multiplication bits stored in the read-write unit circuits.

15. The memory device of claim 14, further comprising a control circuit configured to selectively sense the multiplicand arrangement bits by selectively precharging the bitlines connected to the read-write unit circuits based on the multiplier arrangement bits stored in the read-write unit circuits.

16. The memory device of claim 14, wherein the multiplicand values included in the multiplicand matrix are weight values of a multiplication and accumulation (MAC) operation performed by an artificial neural network (ANN), and the multiplier values included in the multiplier matrix are input values of the MAC operation.

17. The memory device of claim 14, wherein the read-write unit circuits are disposed in a matrix form of rows and columns, and read-write unit circuits from among the read-write unit circuits disposed in a same column are connected commonly to a same input terminal of a weighted adder included in the operation circuit.

18. The memory device of claim 14, wherein the memory device is a NAND flash memory device, and the read-write unit circuits are page buffers configured to perform a sense operation and a write operation of the NAND flash memory device.

* * * * *